(12) United States Patent
Oshima et al.

(10) Patent No.: US 11,408,941 B2
(45) Date of Patent: Aug. 9, 2022

(54) INFORMATION PROCESSING APPARATUS, COMPUTER-READABLE STORAGE MEDIUM, AND INFORMATION PROCESSING METHOD

(71) Applicant: HONDA MOTOR CO., LTD., Tokyo (JP)

(72) Inventors: Ryo Oshima, Saitama (JP); Tomoyuki Koketsu, Saitama (JP); Kenichi Etsunagi, Saitama (JP); Michihito Okado, Saitama (JP); Takumi Shiiyama, Saitama (JP); Ryuichi Kimata, Tokyo (JP)

(73) Assignee: HONDA MOTOR CO., LTD., Tokyo (JP)

( * ) Notice: Subject to any disclaimer, the term of this patent is extended or adjusted under 35 U.S.C. 154(b) by 385 days.

(21) Appl. No.: 16/576,753

(22) Filed: Sep. 19, 2019

(65) Prior Publication Data

US 2020/0018800 A1    Jan. 16, 2020

Related U.S. Application Data

(63) Continuation of application No. PCT/JP2018/011549, filed on Mar. 22, 2018.

(30) Foreign Application Priority Data

Mar. 22, 2017 (JP) .............................. JP2017-056667

(51) Int. Cl.
    *G01R 31/392* (2019.01)
    *G01R 31/36* (2020.01)
    *G01R 31/382* (2019.01)

(52) U.S. Cl.
    CPC ....... *G01R 31/392* (2019.01); *G01R 31/3644* (2013.01); *G01R 31/382* (2019.01)

(58) Field of Classification Search
    CPC .................................................. G01R 31/392
    (Continued)

(56) References Cited

U.S. PATENT DOCUMENTS

| 6,154,006 A | * | 11/2000 | Hatanaka | ............... B60L 53/65 320/109 |
| 10,055,911 B2 | | 8/2018 | Luke | |

(Continued)

FOREIGN PATENT DOCUMENTS

| JP | H11150809 A | 6/1999 |
| JP | 2002140398 A | 5/2002 |

(Continued)

OTHER PUBLICATIONS

International Search Report and (ISA/237) Written Opinion of the International Search Authority for International Patent Application No. PCT/JP2018/011549, mailed by the Japan Patent Office dated Jun. 5, 2018.

(Continued)

*Primary Examiner* — Ricky Go

(57) ABSTRACT

Provided are an abnormality detection unit that detects abnormality or stop of at least one of a plurality of storage battery housing devices, a storage device extraction unit that extracts, when the abnormality detection unit detects the abnormality or the stop, one or more storage battery housing devices related to the storage battery housing device in which the abnormality or the stop is detected from among the plurality of storage battery housing devices, and an adjustment unit that determines adjustment of utilization rate of at least one of the one or more storage battery housing devices extracted by the storage device extraction unit.

9 Claims, 12 Drawing Sheets

(58) Field of Classification Search
USPC .......................................................... 702/63
See application file for complete search history.

(56) References Cited

U.S. PATENT DOCUMENTS

| | | | |
|---|---|---|---|
| 10,065,525 | B2 | 9/2018 | Chen |
| 10,158,102 | B2 | 12/2018 | Wu |
| 10,186,094 | B2 | 1/2019 | Wu |
| 10,209,090 | B2 | 2/2019 | Luke |
| 10,345,843 | B2 | 7/2019 | Luke |
| 2012/0239453 | A1 | 9/2012 | Osogami |
| 2013/0026971 | A1 | 1/2013 | Luke |
| 2013/0030580 | A1 | 1/2013 | Luke |
| 2013/0030581 | A1 | 1/2013 | Luke |
| 2013/0030608 | A1 | 1/2013 | Taylor |
| 2013/0030630 | A1 | 1/2013 | Luke |
| 2013/0030920 | A1 | 1/2013 | Wu |
| 2013/0033203 | A1 | 2/2013 | Luke |
| 2013/0116892 | A1 | 5/2013 | Wu |
| 2014/0142786 | A1 | 5/2014 | Huang |
| 2014/0251710 | A1 | 9/2014 | Juan |
| 2014/0253021 | A1 | 9/2014 | Luke |
| 2014/0266006 | A1 | 9/2014 | Luke |
| 2014/0277844 | A1 | 9/2014 | Luke |
| 2014/0279576 | A1 | 9/2014 | Luke |
| 2014/0368156 | A1* | 12/2014 | Aloe .................. H02J 7/00047 320/106 |
| 2015/0042157 | A1 | 2/2015 | Chen |
| 2016/0099590 | A1* | 4/2016 | Velderman ................ G07F 7/06 320/113 |
| 2017/0085103 | A1* | 3/2017 | Seng ......................... H02J 7/00 |
| 2018/0043785 | A1 | 2/2018 | Takatsuka |
| 2018/0069416 | A1* | 3/2018 | Brace ....................... F03D 9/11 |

FOREIGN PATENT DOCUMENTS

| | | |
|---|---|---|
| JP | 2002216855 A | 8/2002 |
| JP | 2007116799 A | 5/2007 |
| JP | 2012053821 A | 3/2012 |

OTHER PUBLICATIONS

Decision to Grant a Patent issued for counterpart Japanese Application No. 2017-056667, drafted by the Japan Patenl Office dated May 25, 2018.

Office Action issued for counterpart Japanese Application No. 2017-056667, drafted by the Japan Patent Office dated Feb. 13, 2018.

* cited by examiner

| 1100 | | | | | | |
|---|---|---|---|---|---|---|
| BATTERY ID 1110 | DETERIORA-TION LEVEL 1120 | CHARGING SPEED 1130 | CURRENT SOC 1140 | RENT STATUS 1150 | OPERATION STATUS 1160 | STORAGE SITE 1170 |
| B_0001 | LOW | VERY FAST | -- | RENT | -- | USER A |
| B_0002 | LOW | VERY FAST | 100% | RESERVED | STAND-BY | STATION 210 |
| B_0003 | MEDIUM | FAST | 80% | AVAILABLE FOR RENT | CHARGING | STATION 210 |
| B_0004 | HIGH | SLOW | 30% | NON-AVAILABLE FOR RENT | STAND-BY | STATION 210 |
| : | : | : | : | : | : | : |

| 1200 | | | | | | | |
|---|---|---|---|---|---|---|---|
| STATION ID 1210 | RELATED STATION ID 1220 | | | | | | |
| | RELEVANCE: HIGH 1230 | | | RELEVANCE: MEDIUM 1240 | | | |
| | AREA 1232 | DISTANCE 1234 | RENTING HISTORY 1236 | AREA 1242 | DISTANCE 1244 | RENTING HISTORY 1246 | |
| S_0001 | ,,… | ,,… | ,,… | ,,… | ,,… | ,,… | |
| S_0002 | ,,… | ,,… | ,,… | ,,… | ,,… | ,,… | |
| ⋮ | ⋮ | ⋮ | ⋮ | ⋮ | ⋮ | ⋮ | | though the embodiments of the invention, but the following embodiments do not limit the invention as defined in the appended claims. Further, all combinations of features described in the embodiments are not necessarily essential to the solution of the invention. In the drawings, the same or similar portions may be denoted by the same reference numerals and may not described repeatedly.

INFORMATION PROCESSING APPARATUS, COMPUTER-READABLE STORAGE MEDIUM, AND INFORMATION PROCESSING METHOD

CROSS REFERENCE TO RELATED APPLICATION

This is a continuation application of International Application No. PCT/JP2018/011549 filed on Mar. 22, 2018, which claims priority to Japanese Patent Application No. 2017-056667 filed in JP on Mar. 22, 2017, the contents of each of which are incorporated herein by reference.

TECHNICAL FIELD

The present invention relates to an information processing apparatus, a computer-readable storage medium, and an information processing method.

BACKGROUND ART

A charging station that stores a storage battery for an electric motorcycle and provides a user with a full-charged storage battery is known (e.g., see Patent Literature 1).

CITATION LIST

Patent Literature

Patent Literature 1: JP 2016-521389 A

Note that the above summary of the invention does not recite all the necessary features of the present invention. In addition, a sub-combination of such features can also be regarded as the invention.

BRIEF DESCRIPTION OF DRAWINGS

FIG. 11 schematically illustrates an example of a data table 1100.

FIG. 12 schematically illustrates an example of a data table 1200.

DESCRIPTION OF EMBODIMENTS

Hereinafter, the present invention will be described through the embodiments of the invention, but the following

[Outline of Information Processing Apparatus 100]

Figure 1:
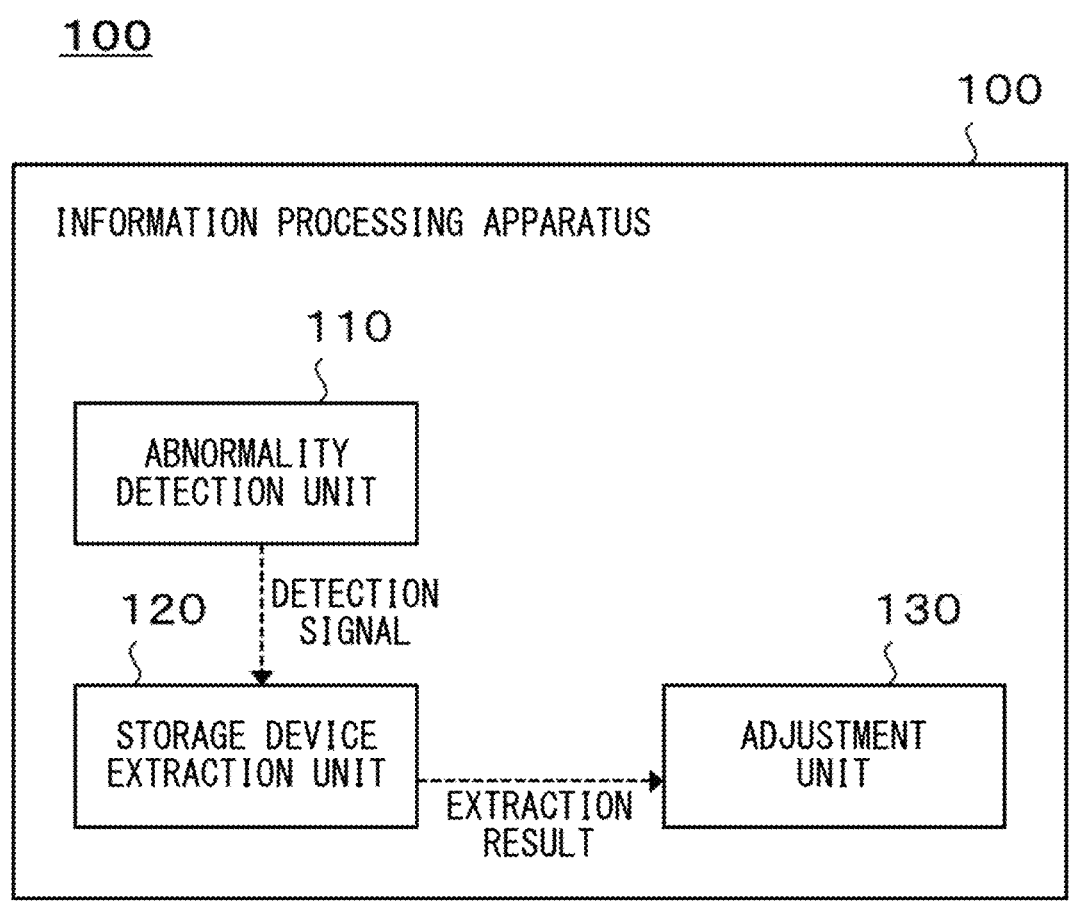
FIG. 1 schematically illustrates an example of a system configuration of an information processing apparatus 100.

FIG. 1 schematically illustrates an example of a system configuration of an information processing apparatus 100. In the present embodiment, when one of charging stations becomes unusable, the information processing apparatus 100 adjusts, for example, the utilization rate of other charging stations. Further, in the present embodiment, when one of charging stations becomes unusable, the information processing apparatus 100 determines of which charging station the utilization rate should be adjusted. In the present embodiment, the information processing apparatus 100 includes, for example, an abnormality detection unit 110. The information processing apparatus 100 includes, for example, a storage device extraction unit 120. The information processing apparatus 100 includes, for example, an adjustment unit 130. Examples of the case when the charging station is unusable include a case where the proper use of the charging station is interrupted (which may also be referred to as abnormality or stop of the charging station) due to a failure or maintenance of the charging station, a local power outage, a surrounding road traffic situation, and the like.

In the present embodiment, the abnormality detection unit 110 detects, for example, an abnormality or stop of at least one of the plurality of storage battery housing devices. For example, upon detection of the abnormality or the stop, the abnormality detection unit 110 transmits a detection signal indicating that the abnormality or the stop is detected to the storage device extraction unit 120. In the present embodiment, when the abnormality detection unit 110 detects the abnormality or the stop, the storage device extraction unit 120 extracts, for example, one or more storage battery housing devices related to the storage battery housing device in which the abnormality or the stop is detected from the plurality of storage battery housing devices. For example, the storage device extraction unit 120 extracts the one or more storage battery housing devices in response to receiving the detection signal from the abnormality detection unit 110. For example, the storage device extraction unit 120 transmits information indicating the extraction result to the adjustment unit 130. In the present embodiment, the adjustment unit 130 determines, for example, adjustment of the utilization rate of at least one of the one or more storage battery housing devices extracted by the storage device extraction unit 120.

For example, when some of the plurality of charging stations become unavailable, the convenience of the user who uses the charging station that is now unusable decreases. According to the present embodiment, when some of the plurality of charging stations become unavailable, the information processing apparatus 100 detects occurrence of the abnormality in the station. Then, the information processing apparatus 100 extracts a charging station associated with the station where the abnormality is detected from the plurality of charging stations. For example, the information processing apparatus 100 extracts a charging station located near the charging station where the abnormality is detected as a related charging station. Further, the information processing apparatus 100 determines adjustment of the utilization rate of at least one of the extracted charging station. More specifically, the information processing apparatus 100 determines an increase of the utilization rate of at least one of the extracted charging stations. This prevents lowering the convenience for the user.

[Specific Configuration of Individual Parts of Information Processing Apparatus 100]

Individual parts of the information processing apparatus 100 may be embodied by hardware, software, or hardware and software. At least some of the individual parts of the information processing apparatus 100 may be embodied by a single server or a plurality of servers. At least some of the individual parts of the information processing apparatus 100 may be realized on a virtual server or a cloud system. At least some of the individual parts of the information processing apparatus 100 may be realized by a personal computer or a portable terminal. Examples of the portable terminal include a mobile phone, a smart phone, a PDA, a tablet, a notebook computer or a laptop computer, a wearable computer, and the like. Individual parts of the battery management system 200 may store information using a distributed ledger technology such as a blockchain or a distributed network.

When at least some of the components constituting the information processing apparatus 100 are embodied by software, the components embodied by the software may be implemented by activating software or a program that defines the operations related to the corresponding components in a typically configured information processing apparatus. The information processing apparatus described above includes (i) a data processing device including a processor such as a CPU or GPU, a ROM, a RAM, a communication interface, and the like, (ii) a keyboard, a pointing device, a touch panel, a camera, an audio input device, a gesture input device, various sensors, an input device such as a GPS receiver, and the like, (iii) an output device such as a display unit, a speaker, or a vibration unit, and (iv) a storage device such as a memory, an HDD, or an SSD (including an external storage device).

In the information processing apparatus described above, the data processing apparatus or storage device may store the software or the program. The above software or program is executed by the processor to cause the above information processing apparatus to execute an operation defined by the software or program. The above software or program may be stored in a non-transitory computer readable recording medium. The above software or program may be a program for causing a computer to function as, or as a part of, the information processing apparatus 100. The software or program may be a program for causing a computer to execute information processing in or a part of the information processing apparatus 100.

[Overview of Battery Management System 200]

Figure 2:
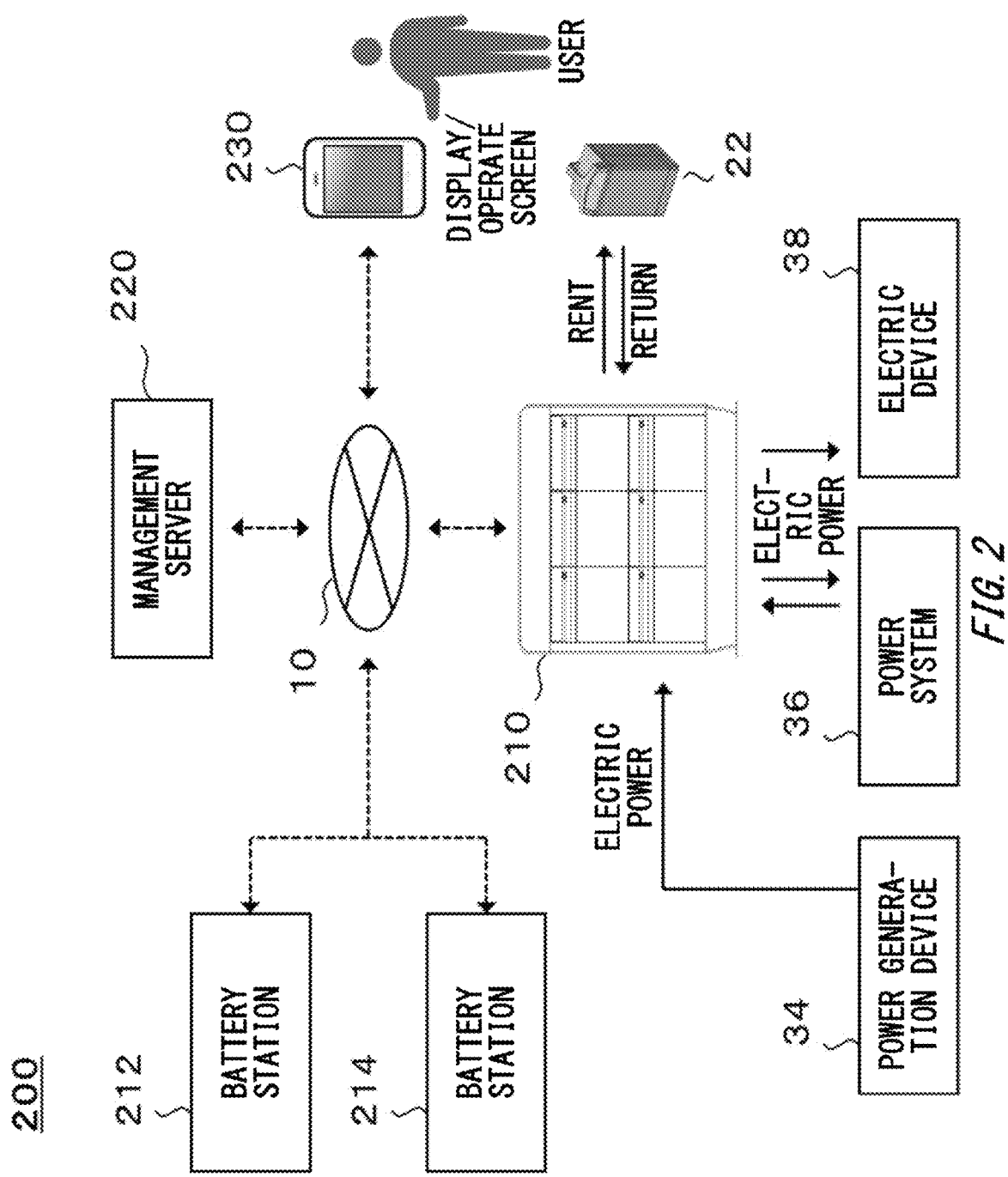
FIG. 2 schematically illustrates an example of a system configuration of a battery management system 200.

FIG. 2 schematically illustrates an example of the system configuration of the battery management system 200. In the present embodiment, the battery management system 200 is described in detail, by taking as an example, a case where the battery management system 200 rents one or more mobile batteries 22 to a user. The user uses the rented mobile battery 22 as a power source for an electric motorcycle, an electric bicycle, a small commuter, an electric cart, or the like.

In the present embodiment, the battery management system 200 manages one or a plurality of mobile batteries 22. For example, the battery management system 200 manages a rent status, an operating state (e.g., charging, discharging, or waiting), a charge state (e.g., the current SOC), a storage state (e.g., a temperature), a deterioration state, and the like of the mobile batteries 22. Note that the form of providing one or more mobile batteries 22 is not limited to renting. Further, "one or more" may be described as "not less than one" or "at least one".

The mobile battery 22 may be used as a power source for a moving object, a work machine, or an electric device. The moving object and the work machine may be a moving object and a work machine each using an electric motor as the power source. Examples of the moving object include an automobile, a motorcycle, a standing vehicle having a power unit, a marine vessel, a flying body, and the like. Examples of the automobile include a gasoline car, a diesel car, an electric car, a fuel cell car, a hybrid car, a small commuter, an electric cart, and the like. Examples of the motorcycle include a motorcycle, a tricycle, an electric bicycle, and the like. Examples of the marine vessel include a boat or a ship, a hovercraft, a water bike, a submarine, a submersible, an underwater scooter, and the like. Examples of the flying object include an airplane, an airship or a balloon, an air balloon, a helicopter, a drone, and the like. Examples of the work machine include a tiller, a snowplow, a lawn mower, a brush cutter, a mower, a high pressure washer, a blower, a rammer, and a battery inverter power source (BIPS).

In the present embodiment, the battery management system 200 includes, for example, a battery station 210, one or more battery stations 212, one or more battery stations 214, and a management server 220. The battery management system 200 may include a user terminal 230. Individual parts of the battery management system 200 may transmit and receive information to and from each other via the communication network 10.

In the present embodiment, the communication network 10 may be a wired communication transmission line, a wireless communication transmission line, or a combination of a wireless communication transmission line and a wired communication transmission line. The communication network 10 may include a wireless packet communication network, the Internet, a P2P network, a dedicated line, a VPN, a power line communication line, and the like. The communication network 10 may include (i) a mobile communication network such as a mobile telephone network, and (ii) a wireless MAN (e.g., WiMAX (registered trademark)), a wireless LAN (e.g., WiFi (registered trademark)), Bluetooth (registered trademark), Zigbee (registered trademark), or wireless communication networks such as Near Field Communication (NFC).

The mobile battery 22 may be an example of a storage battery and a portable storage battery. The battery management system 200 may be an example of an information processing apparatus. The battery station 210, the battery station 212, and the battery station 214 may be an example of the information processing apparatus. The battery station 210, the battery station 212, and the battery station 214 may be an example of a storage battery housing device. The management server 220 may be an example of the information processing apparatus. The user terminal 230 may be an example of the information processing apparatus.

[Overview of Individual Parts of Battery Management System 200]

In the present embodiment, the battery station 210 stores one or more mobile batteries 22. For example, the battery station 210 rents one or more mobile batteries 22 to the user. The battery station 210 may rent a plurality of mobile batteries 22 as a set to the user. The battery station 210 may rent a new mobile battery 22 stored in the battery station 210 to the user in response to the mobile battery 22 used by the user being stored in the battery station 210. The renting of the mobile battery 22 may be an example of a method for providing the mobile battery 22.

The battery station 210 charges one or more mobile batteries 22. The battery station 210 discharges one or more mobile batteries 22. The battery station 210 determines the deterioration state of each of the one or more mobile batteries 22. The battery station 210 may write the determination result regarding the deterioration state of each mobile battery in the memory of each mobile battery.

In the present embodiment, the battery station 210 receives power, for example, from a power generation device 34. The battery station 210 receives power, for example, from a power system 36. Further, the battery station 210 supplies power, for example, to the power system 36. The battery station 210 supplies power, for example, to an electric device 38.

Each of the one or more battery stations 212 may be a battery station associated with the battery station 210 among a plurality of battery stations managed by the battery management system 200. Each of the battery stations 214 may be a battery station other than the battery station 210 and the one or more battery stations 212 among the plurality of battery stations managed by the battery management system 200. Battery stations 212 and 214 may be configured similarly to the battery station 210. Therefore, the battery stations 212 and 214 are note described in detail.

A relevance to the battery station 210 is determined on the basis of, for example, whether or not the relevance with the battery station 210 satisfies a predetermined condition. The above condition may be a condition regarding a geographical relationship with the battery station 210 or a condition regarding a movement history of the mobile battery 22. The movement history of each mobile battery may be a history of the battery station storing the mobile battery. The movement history of each mobile battery may be (i) identification information (which may be referred to as a station ID) of one or more battery stations storing the mobile battery, (ii) information in which the time when the mobile battery is stored in the one or more battery stations is associated with the station ID of the battery station, or (iii) information in which the station ID of the one or more battery stations storing the mobile battery is associated with a frequency of storing the mobile battery in the battery station in a specific period.

In the present embodiment, the management server 220 manages one or more mobile batteries 22 (which may be referred to as mobile batteries to be managed). For example, the management server 220 manages a specification, a rent status, an operating state, a charge state (e.g., the current SOC), a storage state (e.g., temperature), a deterioration state, an error history, a renting history, and the like of the mobile battery to be managed. Examples of the operating state include charging, discharging, standby and the like.

In the present embodiment, the management server 220 manages the battery station 210. The battery station 210 may manage each of the battery station 210, the one or more battery stations 212, and the one or more battery stations 214 (which may also be referred to as battery stations to be managed). For example, the management server 220 manages a location, a specification, a driving status, an operating state, a chief administrator (e.g., identification ID, name, address, telephone number, and the like), an error history, a renting history, and the like of the battery station to be managed.

Examples of the position of the battery station include (i) latitude and longitude, (ii) latitude, longitude, and altitude, (iii) address and the like of the position where the battery station is located. Examples of the specifications of the battery station include the charging capacity of the battery station, the maximum number of mobile batteries 22 that can be stored in the battery station (which may also be referred to as the maximum storage number $N_{MAX}$), and the like.

Examples of the driving state include driving, stopping, abnormality occurring, and the like. Examples of the operating state include (i) the rent status of the mobile battery 22, (ii) a utilization rate, (iii) a priority order of the mobile battery 22 to be rent, and the like of at the battery station to be managed. The rent status includes (i) the number of mobile batteries 22 being rent, (ii) the number of mobile batteries 22 being stored, (iii) the number of mobile batteries 22 available for rent, and (iv) a percentage of the numbers of (i) to (iii) above to the maximum storage number. The utilization rate is determined, for example, as a ratio ($N_{RENT}/N_{MAX}$) of the number $N_{RENT}$ of mobile batteries 22 available for rent to the maximum storage number $N_{MAX}$.

In the present embodiment, the user terminal 230 is a communication terminal of a user who uses the mobile battery 22 or the battery management system 200. For example, the user terminal 230 receives an input from the user. The user terminal 230 may send various requests to the management server 220 on the basis of the input from the user.

In one embodiment, the user terminal 230 receives information for generating a user interface screen (which may also be referred to as a UI screen) from the management server 220. The user terminal 230 may generate a UI screen on the basis of information received from the management server 220 by the user terminal 230. The user terminal 230 may present the generated UI screen to the user. The UI screen may be an example of information output by the user terminal 230. In another embodiment, the user terminal 230 may output audio on the basis of information received by the user terminal 230 from the management server 220.

The user terminal 230 may be any device capable of transmitting and receiving information to and from each unit (e.g., the management server 220) of the battery management system 200 via the communication network 10, and details thereof are not particularly limited. Examples of the user terminal 230 include a personal computer, a portable terminal, and the like. Examples of the portable terminal include a mobile phone, a smart phone, a PDA, a tablet, a notebook computer or a laptop computer, a wearable computer, and the like.

In the present embodiment, the case where the management server 220 manages one or more mobile batteries and one or more battery stations has been described. However, the battery management system 200 is not limited to this embodiment. In another embodiment, at least one of the one or more battery stations has the function of the management server 220, and the at least one battery station manages at least one of the one or more mobile batteries and the one or more battery stations. In this case, the battery management system 200 may not include the management server 220.

[Specific Configuration of Individual Parts of Battery Management System 200]

Individual parts of the battery management system 200 may be embodied by hardware, software, or hardware and software. The individual parts of the battery management system 200 may be realized by a single server or may be realized by a plurality of servers. At least some of the individual parts of the battery management system 200 may be realized on a virtual server or a cloud system. At least some of the individual parts of the battery management system 200 may be realized by a personal computer or a portable terminal. Examples of the portable terminal include a mobile phone, a smart phone, a PDA, a tablet, a notebook computer or a laptop computer, a wearable computer, and the like. Individual parts of the battery management system 200 may store information using a distributed ledger technology such as a blockchain or a distributed network.

When at least some of the components constituting the battery management system 200 are embodied by software, the components embodied by the software may be implemented by activating software or a program that defines the operations related to the corresponding components in a typically configured information processing apparatus. The information processing apparatus described above includes (i) a data processing device including a processor such as a CPU or GPU, a ROM, a RAM, a communication interface, and the like, (ii) a keyboard, a pointing device, a touch panel, a camera, an audio input device, a gesture input device, various sensors, an input device such as a GPS receiver, and the like, (iii) an output device such as a display unit, a speaker, or a vibration unit, and (iv) a storage device such as a memory, an HDD, or an SSD (including an external storage device).

In the information processing apparatus described above, the data processing apparatus or storage device may store the software or the program. The above software or program is executed by the processor to cause the above information processing apparatus to execute an operation defined by the software or program. The above software or program may be stored in a non-transitory computer readable recording medium. The software or program described above may be a program for causing a computer to function as, or as a part of, the battery management system 200. The software or program may be a program for causing a computer to execute information processing in or in a part of the battery management system 200.

The software or program may be a program for causing a computer to execute an arrangement information acquisition step to acquire arrangement information indicating the position where the charging device for charging one or more storage batteries is located. The software or program may be a program for causing a computer to execute a user position acquisition step to acquire user position information indicating the position of the user. The software or program described above may be a program for causing a computer to execute a state information generation step to generate information associated with (i) a charge state at the specific time and (ii) a charge state at the estimated time of arrival of the user at the charging device for at least one of the one or more storage batteries on the basis of (i) the arrangement information acquired in the arrangement information acquisition step and (ii) the user position information acquired in the user position acquisition step.

The software or program described above may be a program for causing a computer to execute a temperature information acquisition step to acquire temperature information indicating the temperature of each of the plurality of storage batteries. The software or program described above may be a program for causing a computer to execute a deterioration information acquisition step to acquire deterioration information indicating the deterioration state of each of a plurality of storage batteries. The software or program described above may be a program for causing a computer to execute a temperature condition determination step to determine a temperature condition allowed at the start of charging or during charging on the basis of the deterioration information acquired by the deterioration information acquisition unit for each of the plurality of storage batteries. The software or program described above may be a program for causing a computer to execute a charge target extraction step to extract the storage battery to be charged from the storage batteries, among the plurality of storage batteries, in which the temperature indicated by the temperature information acquired by the temperature information acquisition unit satisfies the temperature condition determined by the temperature condition determination unit.

The software or program described above may be a program for causing a computer to execute an abnormality detection step to detect the abnormality or stop in at least one of the plurality of storage battery housing devices. The software or program described above may be a program for causing a computer to execute, when the abnormality or stop is detected in the abnormality detection step, a storage device extraction step to extract one or more storage battery housing devices related to the storage battery housing device in which the abnormality or stop is detected from the plurality of storage battery housing devices. The software or program described above may be a program for causing a computer to execute an adjustment step to determine adjustment of a utilization rate of at least one of the one or more storage battery housing devices extracted in the storage device extraction step.

Figure 3:
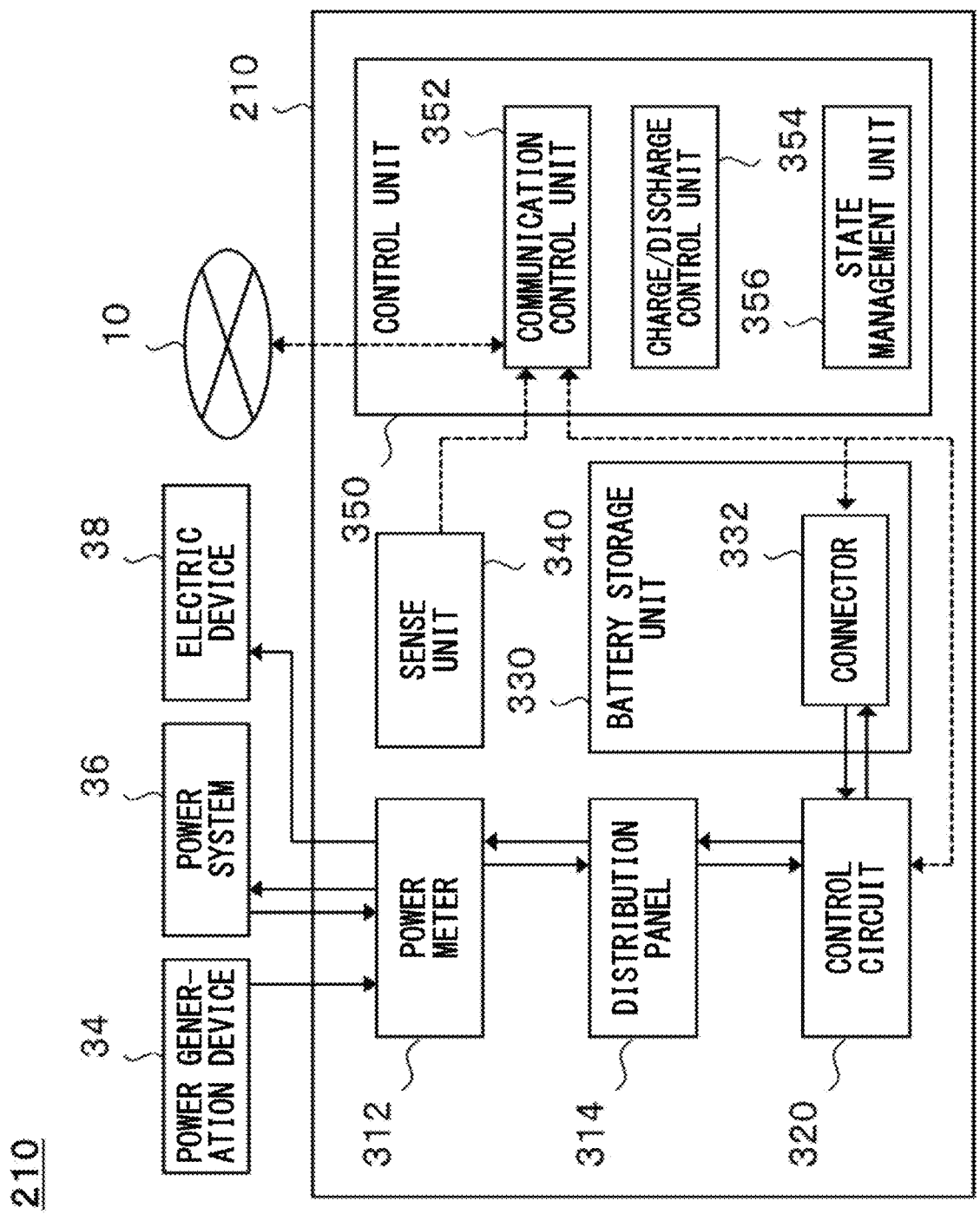
FIG. 3 schematically illustrates an example of an internal configuration of a battery station 210.

FIG. 3 schematically illustrates an example of the internal configuration of the battery station 210. In the present embodiment, the battery station 210 includes, for example, a power meter 312, a distribution panel 314, a control circuit 320, a battery storage unit 330, a connector 332, a sense unit 340, and a control unit 350. In the present embodiment, the control unit 350 includes, for example, a communication control unit 352, a charge/discharge control unit 354, and a state management unit 356. Individual parts of the control unit 350 may mutually transmit/receive information.

The sense unit 340 may be an example of a temperature information acquisition unit and a deterioration information acquisition unit. The control unit 350 may be an example of the information processing apparatus. The communication control unit 352 may be an example of the temperature information acquisition unit, the deterioration information acquisition unit, and a utilization rate acquisition unit. The charge/discharge control unit 354 may be an example of the information processing apparatus. The state management unit 356 may be an example of an abnormality detection unit.

In the present embodiment, the power meter 312 measures the amount of power received by the battery station 210 from at least one of the power generation device 34 and the power system 36 (which may also be referred to as a power supplier). The power meter 312 may measure the amount of power for each power supplier. In the present embodiment, the power meter 312 measures the amount of power supplied by the battery station 210 to at least one of the power system 36 and the electric device 38 (which may also referred to as a power consumer). The power meter 312 may measure the power amount for each power consumer.

In the present embodiment, the distribution panel 314 receives power and branches the power to each part of the battery station 210. The distribution panel 314 may be electrically connected to each of one or more connectors 332. The distribution panel 314 may be electrically connected to each of one or more control circuits 320. The distribution panel 314 may include a power conditioner. The power conditioner may include a bidirectional AC/DC circuit.

In the present embodiment, the control circuit 320 controls charging/discharging of the mobile battery 22. For example, the control circuit 320 receives information or a signal for controlling charge/discharge from the charge/discharge control unit 354. The control circuit 320 may control charging/discharging of the mobile battery 22 on the basis of information or a signal from the charge/discharge control unit 354.

The control circuit 320 may include one or more unidirectional DC-DC circuits. Each of the one or more unidirectional DC-DC circuits may be electrically connected to the one or more connectors 332. The control circuit 320 may include one or more bidirectional DC-DC circuits. Each of the one or more bidirectional DC-DC circuits may be electrically connected to the one or more connectors 332. The control circuit 320 may include as many bidirectional DC-DC circuits as the maximum number of storage of the battery stations 210. The control circuit 320 may include a smaller number of bidirectional DC-DC circuits than the maximum number of storage of the battery stations 210.

In the present embodiment, the battery storage unit 330 stores at least one mobile battery 22. The battery station 210 may include one or more battery storage units 330. Each of the one or more battery storage units 330 may store a single mobile battery 22 or a plurality of mobile batteries 22.

In the present embodiment, the connector 332 is electrically connected to each of the one or more mobile batteries 22. The battery station 210 may include one or more connectors 332. Each of the one or more connectors 332 may be electrically connected to a single mobile battery 22 or may be electrically connected to a plurality of mobile batteries 22. The connector 332 and the mobile battery 22 may be connected in a wired manner or a wireless manner. The connector 332 transmits, for example, power between the mobile battery 22 and the control circuit 320. The connector 332 may transmit a communication signal between the mobile battery 22 and the communication control unit 352. The connector 332 is disposed, for example, inside the battery storage unit 330.

In the present embodiment, the sense unit 340 measures various physical quantities related to at least one of the mobile battery 22 and the battery station 210. Thus, the sense unit 340 may acquire information on at least one of the one or more mobile batteries 22, or may acquire information on each of the one or more mobile batteries 22. The sense unit 340 may transmit the acquired information to the control unit 350. The sense unit 340 may include one or more kinds of sensors. For example, the sense unit 340 includes one or more thermometers that measure at least one temperature of the one or more mobile batteries 22. The measuring method of the thermometer may be a contact type or a non-contact type. The sense unit 340 may be an overcurrent/overvoltage detector that detects at least one of overvoltage and overcurrent of at least one of the one or more mobile batteries 22.

In the present embodiment, the control unit 350 controls the operation of the battery station 210. The control unit 350 executes various information processing methods in the battery station 210. The control unit 350 may receive information or a request from at least one of the management server 220 and the user terminal 230. The control unit 350 may transmit information or a request to at least one of the management server 220 and the user terminal 230. The control unit 350 may read information recorded in the memory of the mobile battery 22. The control unit 350 may write information into the memory of the mobile battery 22.

The memory of the mobile battery 22 stores, for example, user identification information (which may also be referred to as a user ID), identification information of the mobile battery 22 (which may also be referred to as a battery ID), information indicating a movement history or a moving distance of the user or the mobile battery 22, information indicating a deterioration state of the mobile battery 22, information indicating restrictions on charging of the mobile battery 22 (which may also be referred to as a charge condition), information indicating restrictions on discharging of the mobile battery 22 (which may also be referred to as a discharge condition), and the like. User identification information includes: (i) an ID assigned to each user by the battery management system 200 administrator; (ii) a user name, an official name, a common name or a nickname; (iii) a user address, telephone number, various service accounts (e.g., an SNS account), (iv) an ID of a device (e.g., an electric motorcycle or an electric bicycle) that uses the mobile battery 22.

In the present embodiment, the communication control unit 352 controls communication. In one embodiment, the communication control unit 352 controls communication between the control unit 350 and the individual parts of the battery station 210. In another embodiment, the communication control unit 352 controls communication between the control unit 350 and devices outside the battery station 210. For example, the communication control unit 352 controls communication between the control unit 350 and at least one of the management server 220 and the user terminal 230. For example, the communication control unit 352 controls communication between the control unit 350 and the mobile battery 22. The communication control unit 352 may be a communication interface. The communication control unit 352 may support one or more kinds of communication methods.

In the present embodiment, the charge/discharge control unit 354 controls charging/discharge of one or more mobile batteries 22. The charge/discharge control unit 354 controls charging/discharging of the mobile battery 22, for example, by controlling the control circuit 320. The charge/discharge control unit 354 controls, for example, timing for starting charging or discharging each of the one or more mobile batteries 22, timing for ending the charging or discharging, a charging speed or discharging speed, and the like. The charge/discharge control unit 354 may create a charge/discharge schedule. For example, the charge/discharge control unit 354 determines which of the one or more mobile batteries 22 stored in the battery station 210 is to be charged. The charge/discharge control unit 354 may determine which of the one or more mobile batteries 22 stored in the battery station 210 is to be charged by when to what extent.

In the present embodiment, the state management unit 356 manages the state of the battery station 210. For example, the state management unit 356 manages at least one of the driving state and the operating state of the battery station 210. The state management unit 356 may detect abnormality or stop of the battery station 210. The state management unit 356 detects the abnormality or the stop of the battery station 210 when the charging station is prevented from being used normally due to, for example, a failure or maintenance of the battery station 210, a power outage in an area around the battery station 210, a road traffic situation around the battery station 210, or the like.

The state management unit 356 may manage the state of one or more mobile batteries 22 stored in the battery station 210. For example, the state management unit 356 manages at least one of the operating state, the charge state, the storage state, and the deterioration state of the mobile battery 22 described above. The state management unit 356 may detect the abnormality of the mobile battery 22. The state management unit 356 may manage at least one of the state of the battery station 210 and the state of one or more mobile batteries 22 on the basis of the information acquired by the sense unit 340.

In the present embodiment, the case where the control unit 350 is arranged in the battery station 210 has been described. However, the control unit 350 is not limited to this embodiment. In another embodiment, the function of the control unit 350 or a part of the function of the control unit 350 is realized by the management server 220. For example, at least one of the charge/discharge control unit 354 and the state management unit 356 is located in the management server 220. A part of the charge/discharge control unit 354 may be located in the management server 220. A part of the state management unit 356 may be located in the management server 220.

Figure 4:
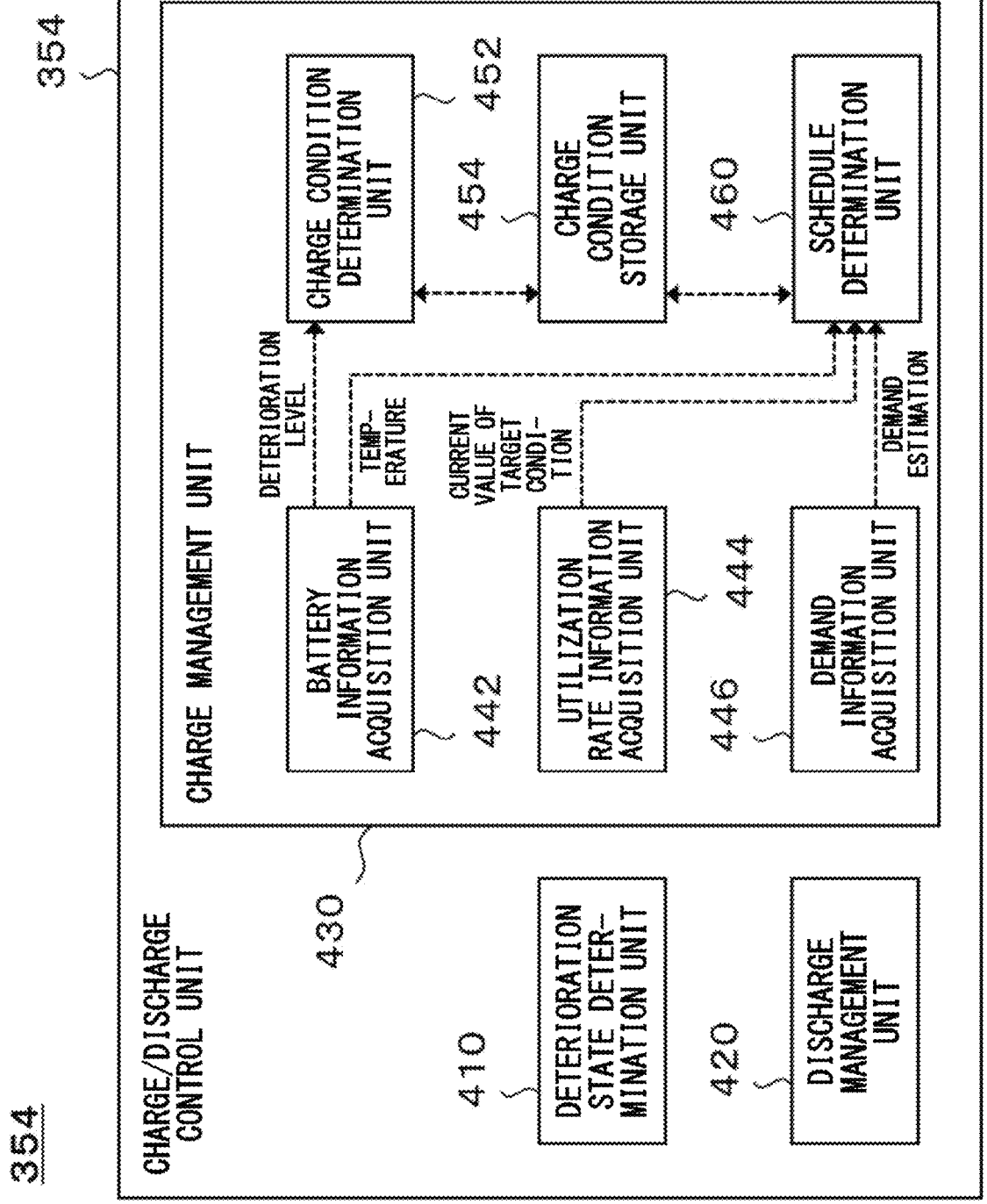
FIG. 4 schematically illustrates an example of an internal configuration of a charge/discharge control unit 354.

FIG. 4 schematically illustrates an example of the internal configuration of the charge/discharge control unit 354. In the present embodiment, the charge/discharge control unit 354 includes, for example, a deterioration state determination unit 410, a discharge management unit 420, and a charge management unit 430. In the present embodiment, the charge management unit 430 includes, for example, a battery information acquisition unit 442, a utilization rate information acquisition unit 444, a demand information acquisition unit 446, a charge condition determination unit 452, a charge condition storage unit 454, and a schedule determination unit 460.

The deterioration state determination unit 410 may be an example of the deterioration information acquisition unit. The charge management unit 430 may be an example of the information processing apparatus. The battery information acquisition unit 442 may be an example of the charge state acquisition unit, the temperature information acquisition unit, and the deterioration information acquisition unit. The utilization rate information acquisition unit 444 may be an example of the charge state acquisition unit and a utilization rate acquisition unit. The demand information acquisition unit 446 may be an example of the demand acquisition unit. The charge condition determination unit 452 may be an example of the temperature condition determination unit. The schedule determination unit 460 may be an example of the charge target extraction unit.

In the present embodiment, the deterioration state determination unit 410 determines at least one deterioration state of one or more mobile batteries 22 stored in the battery station 210. For example, the deterioration state determination unit 410 charges or discharges the mobile battery 22 to be determined according to a predetermined charge/discharge pattern. The deterioration state determination unit 410 analyzes an obtained charging/discharging curve and determines the deterioration state of the deterioration state determination unit 410. The deterioration state determination unit 410 may write information indicating the deterioration state of the mobile battery 22 in the memory of the mobile battery 22.

In the present embodiment, the discharge management unit 420 manages discharge of each of the one or more mobile batteries 22. For example, the discharge management unit 420 may create a discharge schedule of the battery station 210 and may manage the discharge of the one or more mobile batteries 22 according to the schedule. The discharge schedule may include information on timing of starting the discharge of the mobile battery 22 to be discharged, timing of ending the discharge, the discharging speed, and the like. The discharge management unit 420 may generate a command for controlling the discharge of the mobile battery 22 to be managed, and transmit the command to the control circuit 320.

The charge management unit 430 manages charging of each of the one or more mobile batteries 22. For example, the charge management unit 430 creates a charge schedule for the battery station 210 and manages the charging of the one or more mobile batteries 22 according to the schedule. The charge schedule may include information on timing of starting the charge of the mobile battery 22 to be charged, timing of ending the charge, the charging speed, and the like. The charge management unit 430 may generate a command for controlling the charge of the mobile battery 22 to be charged and send the command to the control circuit 320.

The charge management unit 430 can first determines, on the basis of a supply and demand estimate of power, a demand estimate of the mobile batteries 22, a reservation status of the mobile batteries 22, a target condition of the utilization rate of the battery station 210, and the like, at least one of (i) the number of mobile batteries 22 that are available for rent to users, (ii) the number of mobile batteries 22 that can store the power received from the power generation device 34, and (iii) the number of mobile batteries 22 that can supply power to the electric device 38. Next, the charge management unit 430 extracts the mobile battery 22 to be charged by considering the charge condition of each of the one or more mobile batteries 22. Subsequently, the charge management unit 430 determines the timing of starting charging, the timing of ending charging, the charging speed, and the like on the basis of the supply and demand estimate of power, the demand estimate of the mobile batteries 22, the reservation status of the mobile batteries 22, and the like.

In the present embodiment, the battery information acquisition unit 442 acquires various kinds of information on each of the one or more mobile batteries 22 stored in the battery station 210. In one embodiment, the battery information acquisition unit 442 accesses the memory of each of the one or more mobile batteries 22 and acquires various kinds of information related to the mobile battery stored in the memory. For example, the battery information acquisition unit 442 acquires the deterioration information of the mobile battery from the memory of each mobile battery. In another embodiment, the battery information acquisition unit 442 acquires various kinds of information on each of the one or more mobile batteries 22 stored in the battery station 210 from the management server 220.

In yet another embodiment, the battery information acquisition unit 442 acquires various kinds of information on each of the one or more mobile batteries 22 from the sense unit 340. The battery information acquisition unit 442 may acquire information indicating various measurement results for each of the one or more mobile batteries 22 at the current time or the latest measurement time from the sense unit 340. The battery information acquisition unit 442 may acquire, from the sense unit 340, information in which various measurement results for each of the one or more mobile batteries 22 are associated with measurement time at which each measurement result is acquired. The current time, the latest measurement time, and the measurement time when the measurement result is acquired may be examples of specific time.

For example, the battery information acquisition unit 442 acquires information indicating the temperature of each of the one or more mobile batteries 22 (which may also be referred to as temperature information) from the sense unit 340. The battery information acquisition unit 442 may acquire information indicating the charge state of each of the one or more mobile batteries 22 from the sense unit 340. The information indicating the charge state may be information indicating the SOC or information for calculating the SOC. Examples of the information for calculating the SOC include information indicating a voltage, information indicating a cumulative value of the charging current, and the like.

In the present embodiment, the utilization rate information acquisition unit 444 acquires information indicating the target condition of the utilization rate of the battery station 210 from the management server 220. The target condition may be a value or a range of the target of the utilization rate. In the present embodiment, the utilization rate information acquisition unit 444 acquires information indicating the charge state of each of the one or more mobile batteries 22 from the sense unit 340 or the battery information acquisition unit 442. The utilization rate information acquisition unit 444 calculates or acquires the utilization rate of the battery station 210 on the basis of the information indicating the charge state of each mobile battery.

In the present embodiment, the demand information acquisition unit 446 acquires information on the demand for the mobile battery 22 (which may also be referred to as demand information) from the management server 220. Examples of the demand information include the demand estimate of the mobile batteries 22, the reservation status of the mobile batteries 22, and the like. The demand information may include information regarding the time or period and information indicating the number of mobile batteries 22 required at the time or during the period. The demand information may include information indicating the number of required mobile batteries 22 and information indicating conditions on the charge state of each mobile battery.

In the present embodiment, the charge condition determination unit 452 determines the charge condition for each of the one or more mobile batteries 22. For example, the charge condition determination unit 452 determines a temperature condition that is allowable at the start of charging or during charging for each of the one or more mobile batteries 22 on the basis of the deterioration information of each mobile battery. The charge condition determination unit 452 may determine a temperature condition for the charge state (e.g., the SOC value or range) for each of the one or more mobile batteries 22. Examples of the temperature condition include a threshold at which charging is permitted, a threshold at which charging is prohibited, a temperature range in which charging is permitted, a temperature range in which charging is prohibited, and the like. The temperature condition may be an example of the charge condition.

In one embodiment, the charge condition determination unit 452 determines the temperature condition in a manner that, as the deterioration of the mobile battery 22 proceeds, (i) the allowable temperature range is widened, (ii) the maximum allowable temperature is raised, or (ii) the minimum allowable temperature is lowered. In another embodiment, the charge condition determination unit 452 determines the temperature condition in a manner that, as the deterioration of the mobile batteries 22 progresses, (i) the temperature range is narrowed, (ii) the maximum allowable temperature is lowered, or (iii) the minimum allowable temperature is raised.

In the present embodiment, the charge condition storage unit 454 stores information indicating the charge condition determined by the charge condition determination unit 452. For example, the charge condition storage unit 454 stores a battery ID and a charge condition in association with each other for one or more mobile batteries 22.

In the present embodiment, the schedule determination unit 460 determines at least one of a charge schedule and a discharge schedule in the battery station 210. For example, the schedule determination unit 460 determines the charge schedule according to the following procedure. Note that the schedule determination unit 460 may determine the discharge schedule according to the same procedure as the charge schedule.

The schedule determination unit 460 first determines, on the basis of a power supply and demand estimate, a demand estimate of the mobile batteries 22, a reservation status of the mobile batteries 22, a target condition of the utilization rate of the battery station 210, and the like, (i) the number of mobile batteries 22 ($N_{RENT}$) that are available for rent to the users, (ii) the number of mobile batteries 22 that can store the power received from the power generation device 34, and (iii) the number of mobile batteries 22 that can supply power to the electric device 38. For example, the schedule determination unit 460 acquires information indicating the target condition of the utilization rate of the battery station 210 from the management server 220 and, on the basis of the target condition, determines the number of mobile batteries 22 that are available for rent to the user ($N_{RENT}$).

Next, the charge management unit 430 extracts the mobile battery 22 to be charged (which may also be referred to as a charge target) by considering the charge condition of one or more mobile batteries 22. The schedule determination unit 460 extracts, for example, the mobile battery 22 to be charged according to the following procedure. First, the schedule determination unit 460 acquires information indicating the temperature of each of the one or more mobile batteries 22 stored in the battery station 210 from the battery information acquisition unit 442. Further, the schedule determination unit 460 accesses the charge condition storage unit 454, refers to the information on the charge condition of each mobile battery determined by the charge condition determination unit 452, and acquires information indicating the temperature condition of the one or more mobile batteries 22 stored in the battery station 210.

Next, for each of the one or more mobile batteries 22 stored in the battery station 210, the schedule determination unit 460 determines whether the temperature of the mobile battery satisfies the temperature condition of the mobile battery. The schedule determination unit 460 extracts, as the mobile batteries 22 to be charged, the number of mobile batteries 22 corresponding to the number of mobile batteries 22 that are available for rent ($N_{RENT}$) from among the mobile batteries 22 determined to satisfy the temperature condition. The schedule determination unit 460 may extract the mobile batteries 22 to be charged on the basis of the priority order set for each mobile battery.

In one embodiment, the priority order of at least some of the one or more mobile batteries 22 may be set by an administrator of the battery management system 200 or an administrator of the mobile battery 22. In another embodiment, the priority order of at least some of the one or more mobile batteries 22 may be set on the basis of a predetermined condition. In a further embodiment, the priority order of at least some of the one or more mobile batteries 22 may be set on the basis of the reservation information. For example, when the reservation information includes information indicating a specific mobile battery 22 to be designated and reserved, the priority order of the designated mobile batteries 22 is set according to the scheduled time of rent. The priority order of the mobile batteries 22 may be set according to the presence or absence of designation in the reservation information.

If the mobile battery 22 specified by the reservation information is newly designated to be charged, in addition to one or more mobile batteries 22 that are currently being charged, it may not be possible to satisfy the target condition for the utilization rate. In this case, the schedule determination unit 460 may determine to interrupt or stop the charge operation of at least one of the one or more mobile batteries 22 that is currently being charged.

Note that the schedule determination unit 460 compares the demand information acquired by the demand information acquisition unit 446 to the charge states of the one or more mobile batteries 22 stored in the battery station 210 and, if none of the one or more of the mobile batteries 22 stored in the battery station 210 satisfy the demand indicated by the demand information, may extract the mobile battery 22 to be charged. The schedule determination unit 460 may not extract the mobile battery 22 to be charged when the one or more mobile batteries 22 stored in the battery station 210 satisfy the demand indicated by the demand information.

When the mobile battery 22 to be charged is extracted, the schedule determination unit 460 determines the timing of starting the charge, the timing of ending the charge, the charging speed, and the like, on the basis of the power supply and demand estimate, the demand estimate of the mobile batteries 22, the reservation status of the mobile batteries 22, and the like. Accordingly, the schedule determination unit 460 can create a charge schedule for the battery station 210.

Figure 5:
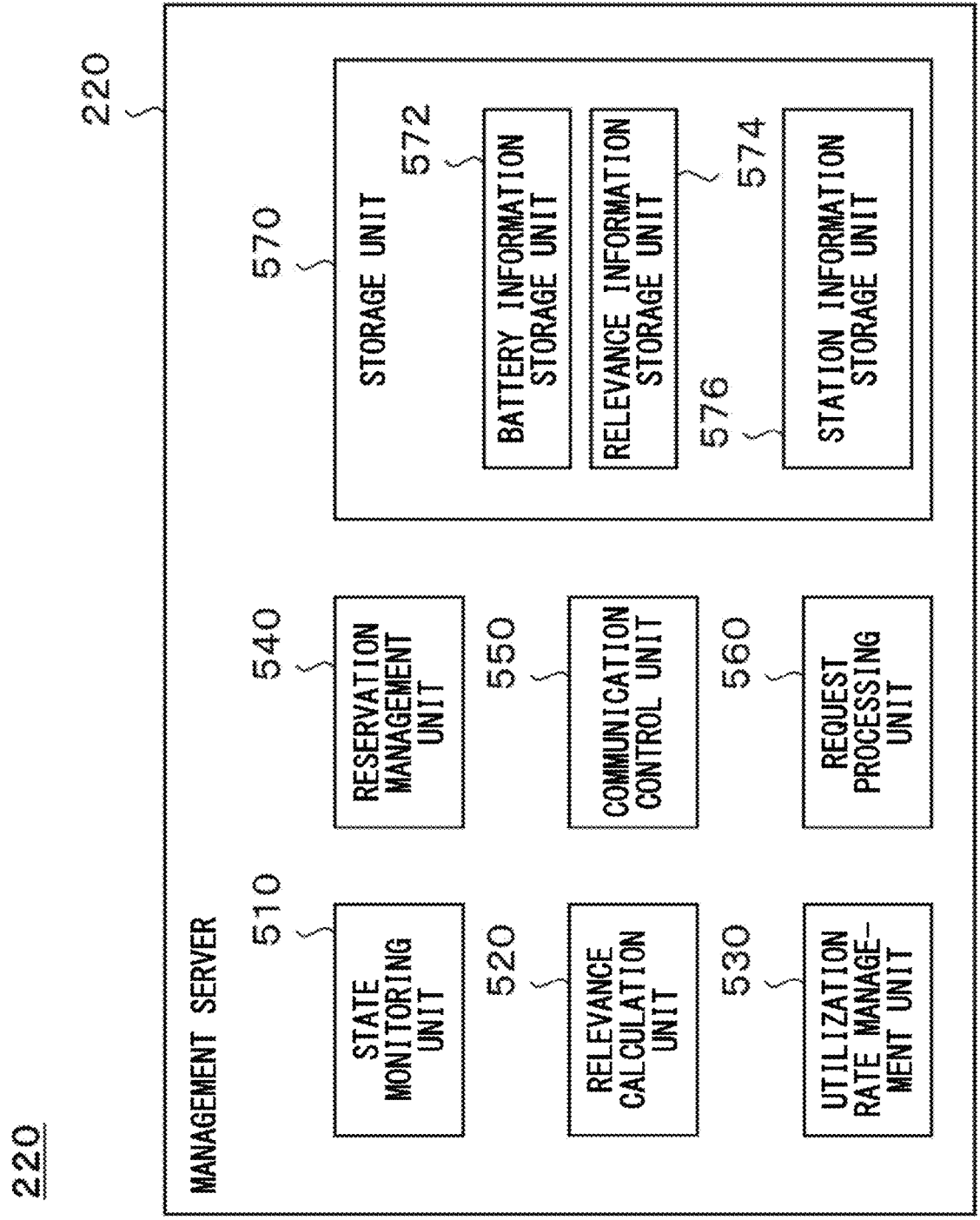
FIG. 5 schematically illustrates an example of a system configuration of a management server 220.

FIG. 5 schematically illustrates an example of the system configuration of the management server 220. In the present embodiment, the management server 220 includes, for example, a state monitoring unit 510, a relevance calculation unit 520, a utilization rate management unit 530, a reservation management unit 540, a communication control unit 550, a request processing unit 560, and a storage unit 570. In the present embodiment, the storage unit 570 includes, for example, a battery information storage unit 572, a relevance information storage unit 574, and a station information storage unit 576.

The state monitoring unit 510 may be an example of the user position acquisition unit, the charge state acquisition unit, the moving speed acquisition unit, the temperature information acquisition unit, the deterioration information acquisition unit, and a utilization rate acquisition unit. The utilization rate management unit 530 may be an example of the information processing apparatus. The request processing unit 560 may be an example of the information processing apparatus. The relevance information storage unit 574 may be an example of the relevance level storage unit.

In the present embodiment, the state monitoring unit 510 monitors each battery station to be managed. The state monitoring unit 510 acquires information on at least one of the driving status and the operating state of each battery station from each of the battery stations to be managed. For example, the state monitoring unit 510 acquires information indicating the utilization rate of each battery station from each of the battery stations to be managed. The state monitoring unit 510 may acquire information indicating the presence or absence of abnormality in each battery station from each of the battery stations to be managed. The state monitoring unit 510 may acquire information indicating the stop or schedule of stop of each battery station 210 from each of the battery stations to be managed.

In the present embodiment, the state monitoring unit 510 monitors each mobile battery to be managed. For example, the state monitoring unit 510 acquires information on at least one of the operating state, the charge state, the storage state, and the deterioration state of the mobile batteries stored in each battery station from each of the battery stations to be managed.

In the present embodiment, the state monitoring unit 510 monitors the state of the user. For example, the state monitoring unit 510 acquires various kinds of information about the user from the user terminal 230. The state monitoring unit 510 may acquire position information indicating the position of the user terminal 230 from the user terminal 230. The state monitoring unit 510 may acquire information indicating the movement history of the user terminal 230 from the user terminal 230. In this case, the movement history may be represented by the position indicated by the GPS signal and the time when the GPS signal is received.

The state monitoring unit 510 may acquire information on the movement history of the user stored in the memory of the mobile battery to be managed from each of the battery stations to be managed. In one embodiment, the movement history may be represented by a station ID of the battery station storing the mobile battery and time at which the mobile battery is stored in the battery station. Information on the movement history of the user is written, for example, in the memory of the mobile battery 22 by the battery station that stores the mobile battery. In another embodiment, the movement history may be represented by a position indicated by a GPS signal and time when the GPS signal is received. Information on the movement history of the user is written, for example, in the memory of the mobile battery by a moving object that uses the mobile battery.

The state monitoring unit 510 may acquire information regarding the moving speed of the user stored in the memory of the mobile battery to be managed from each of the battery stations to be managed. The information on the moving speed of the user may be, for example, information indicating a statistic amount of the moving speed of the user. According to one embodiment, information indicating a history or statistic amount of the moving speed of the user is written in a memory of the mobile battery by a moving object that uses the mobile battery. According to another embodiment, the state monitoring unit 510 may calculate or acquire the statistic amount of moving speed of the user on the basis of the movement history of the user terminal 230 or the user The information indicating the movement history of the user terminal 230 or the user may be an example of information regarding the moving speed of the user.

In the present embodiment, the relevance calculation unit 520 calculates the degree of relationship (which may also be referred to as the relevance) of each station to be managed. For example, the relevance calculation unit 520 calculates the relevance between the battery station 210 and each of the one or more battery stations 212 and the one or more battery stations 214. The relevance may be expressed by a continuous numerical values or may be indicated by a plurality of units. The relevance calculation unit 520 stores the calculated relevance in the relevance information storage unit 574. The relevance may be an example of the relevance level.

The relevance calculation unit 520 may calculate the relevance on the basis of at least one of (i) a geographical relationship between each of at least one battery station and each of one or more other battery stations, and (ii) the movement history of the mobile battery 22 between each of at least one battery station and each of one or more other battery stations. For example, the relevance calculation unit 520 calculates a relevance between the battery station 210 and each of the one or more battery stations 212 and the one or more battery stations 214 based on at least one of (i) a geographical relationship between the battery station 210 and each of the one or more battery stations 212 and the one or more battery stations 214, and (ii) a movement history of the one or more mobile batteries 22 between the battery station 210 and each of the one or more battery stations 212 and the one or more battery stations 214.

Examples of the geographical relationship include a distance between two battery stations, a relationship between areas where the two battery stations are arranged, and the like. As described above, the movement history of each mobile battery may be the history of the battery station in which the mobile battery is stored. According to one embodiment, the closer the distance between two battery stations, the greater the relevance. According to another embodiment, the closer the distance between the areas where the two battery stations are located, the greater the relevance. According to yet another embodiment, the greater the frequency with which the same mobile battery 22 is stored in two battery stations, the greater the relevance.

According to yet another embodiment, with respect to another battery station located between one battery station and the battery station whose relevance to the one battery station is greater than a predetermined value, the relevance between the one battery station 210 and the other battery station may be calculated on the basis of at least one of (i) a magnitude of the relevance of the battery station with the high degree of relevance, and (ii) the geographical relationships between the other battery station and the one battery station and/or the battery station with the high degree of relevance. The relevance between the one battery station 210 and the other battery station may be the same as or smaller than the relevance between the one battery station 210 and the battery station with the high degree of relevance.

For example, the relevance between the one battery station 210 and the other battery station is larger, as a total value of (i) a linear distance between the one battery station and the battery station with the high degree of relevance and (ii) a linear distance between the one battery station and the other battery station and a linear distance between the other battery station and the battery station with the high degree of relevance is smaller. For example, the relevance between the one battery station 210 and the other battery station is larger, as a total value of (i) a statistic amount of the movement time of the one battery station and the battery station with the high degree of relevance and (ii) a statistic amount of the movement time of the one battery station and the other battery station and a statistic amount of the movement time of the other battery station and the battery station with the high degree of relevance is smaller.

In the present embodiment, the utilization rate management unit 530 manages the utilization rate of at least some of the battery stations to be managed. For example, the utilization rate management unit 530 manages the utilization rates of at least some of the plurality of battery stations so that the statistic amount of the utilization rates of the plurality of battery stations located in a specific area satisfy the target condition. The utilization rate management unit 530 may manage the utilization rate of each battery station to be managed. Details of the utilization rate management unit 530 will be described later.

In the present embodiment, the reservation management unit 540 manages the reservation status of the mobile battery to be managed. For example, the reservation management unit 540 stores the result of reservation reception processing (which may also be referred to as reservation information) in the request processing unit 560. The reservation information includes, for example, information on a user ID, a receipt date, scheduled time of receipt, a station ID, a battery ID, a desired charge state, a usage fee, a payment method, and the like. The reservation information may include information indicating time when the reservation request is received (which may also be referred to as a reservation time) and information indicating the position of a user at the reservation time. The reservation management unit 540 may manage a history of reservation information.

In the present embodiment, the communication control unit 550 controls communication. In one embodiment, the communication control unit 550 controls communication between the management server 220 and each of the battery stations to be managed. In another embodiment, the communication control unit 550 controls communication between the management server 220 and the user terminal 230. The communication control unit 550 may be a communication interface. The communication control unit 550 may support one or more kinds of communication methods.

In the present embodiment, the request processing unit 560 receives various requests from the user terminal 230. The request processing unit 560 receives various requests from at least one of the battery stations to be managed. The request processing unit 560 processes the received request. The request processing unit 560 processes the received request. Details of the request processing unit 560 will be described later.

In the present embodiment, the storage unit 570 stores various kinds of information. In the present embodiment, the battery information storage unit 572 stores information on each mobile battery to be managed. The battery information storage unit 572 may store various kinds of information regarding the user of the mobile battery 22. The battery information storage unit 572 may store various kinds of information on one or more users. The battery information storage unit 572 may store information on the movement history or moving speed of each of the one or more users. In the present embodiment, the station information storage unit 576 stores various kinds of information on each battery station to be managed.

In the present embodiment, the relevance information storage unit 574 stores information indicating the relevance. The relevance information storage unit 574 may store each battery station to be managed by associating the station ID of the battery stations and a management level of each of the other battery stations. The relevance information storage unit 574 may store each battery station to be managed by associating the station ID of the battery stations, a category of the management level, and the station IDs of other battery stations classified in the category.

Figure 6:
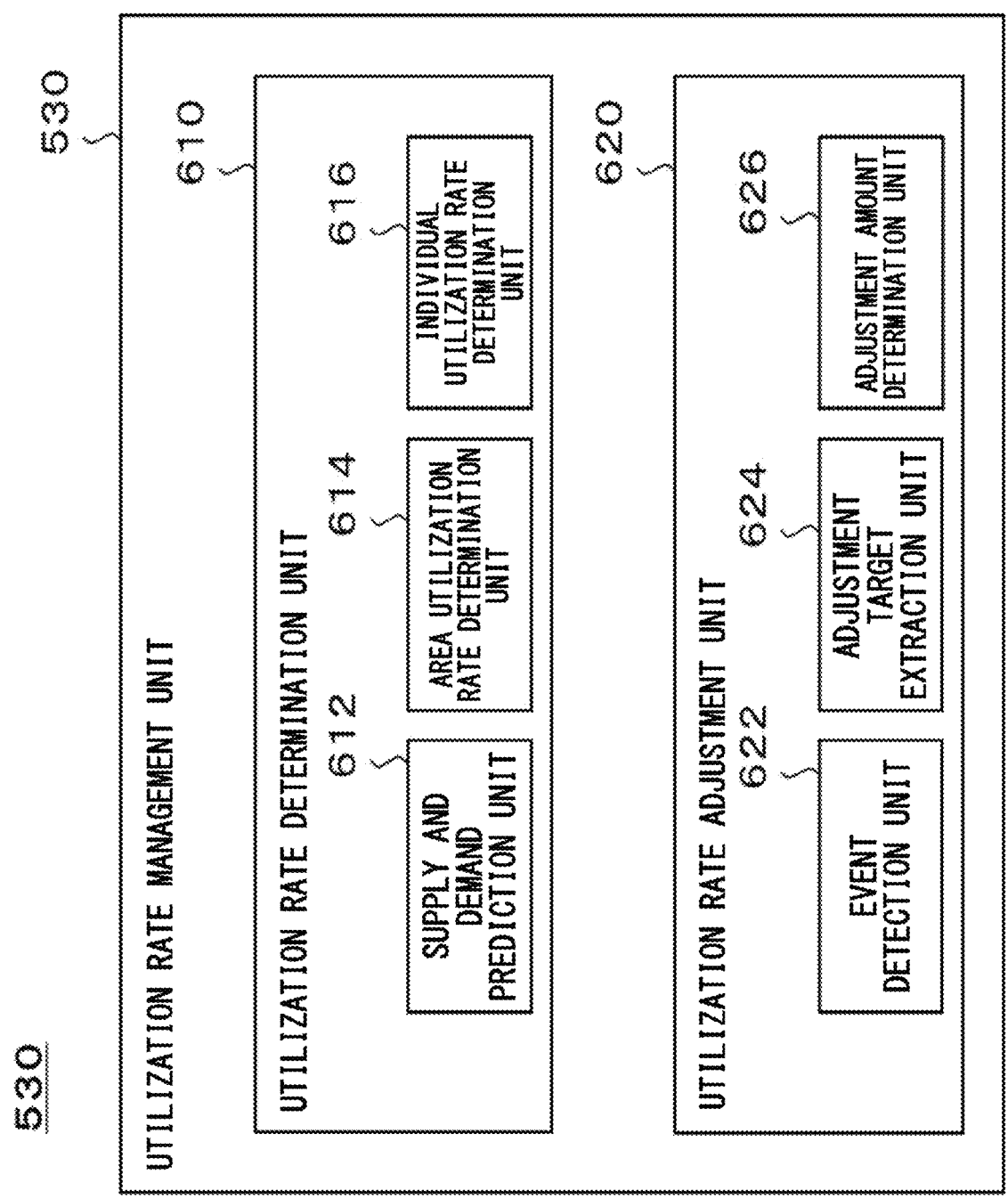
FIG. 6 schematically illustrates an example of an internal configuration of a utilization rate management unit 530.

FIG. 6 schematically illustrates an example of the internal configuration of the utilization rate management unit 530. In the present embodiment, the utilization rate management unit 530 includes, for example, a utilization rate determination unit 610 and a utilization rate adjustment unit 620. In the present embodiment, the utilization rate determination unit 610 includes, for example, a supply and demand prediction unit 612, an area utilization rate determination unit 614, and an individual utilization rate determination unit 616. In the present embodiment, the utilization rate adjustment unit 620 includes, for example, an event detection unit 622, an adjustment target extraction unit 624, and an adjustment amount determination unit 626.

The utilization rate adjustment unit 620 may be an example of the information processing apparatus. The event detection unit 622 may be an example of the abnormality detection unit. The adjustment target extraction unit 624 may be an example of the utilization rate acquisition unit and the storage device extraction unit. The adjustment amount determination unit 626 may be an example of the adjustment unit.

In the present embodiment, the utilization rate determination unit 610 determines the target condition of the utilization rate of at least some of the battery stations to be managed. The utilization rate determination unit 610 may determine the target condition of the utilization rate of each battery station to be managed. The utilization rate determination unit 610 may determine the target condition of the utilization rate at specific time or during a specific period.

In the present embodiment, the supply and demand prediction unit 612 predicts power supply and demand at each battery station to be managed. The supply and demand prediction unit 612 may predict power supply and demand at specific time or during a specific period. In one embodiment, the supply and demand prediction unit 612 predicts the demand for mobile batteries at each battery station. In another embodiment, the supply and demand prediction unit 612 predicts the amount of power generated by the power generation device 34 at each battery station. In yet another embodiment, the supply and demand prediction unit 612 predicts the required power amount of the electric device 38 at each battery station.

The supply and demand prediction unit 612 predicts the power supply and demand at each battery station on the basis of, for example, at least one of event information, weather information, disaster information, accident information, traffic information, and various history information around each battery station. The supply and demand prediction unit 612 may predict the demand for mobile batteries at each battery station on the basis of at least one of (i) at least one of event information, weather information, disaster information, accident information, and traffic information in the area of each battery station, (ii) history information of the past rent status or reservation status in each battery station, and (iii) information on the current reservation status at each battery station.

The supply and demand prediction unit 612 may generate information on power supply and demand. For example, the supply and demand prediction unit 612 generates demand information of the mobile battery 22 for each battery station to be managed. The demand information may be information in which information indicating specific time or a specific period is associated with the number of mobile batteries 22 available for rent at the specific time or during the specific period.

In the present embodiment, the area utilization rate determination unit 614 determines the target condition of the utilization rate for each area on the basis of the information regarding the power supply and demand generated by the supply and demand prediction unit 612. In the present embodiment, the individual utilization rate determination unit 616 determines the target condition of the utilization rate for each battery station on the basis of the information on the power supply and demand generated by the supply and demand prediction unit 612.

In the present embodiment, the utilization rate adjustment unit 620 determines adjustment of the target condition of the utilization rate when an event that may cause a change in the utilization rate of at least one battery station among the battery stations to be managed occurs. Upon detection of the occurrence of the event, the utilization rate adjustment unit 620 may transmit information indicating the occurrence of the event to the user terminal 230. Upon determination of adjustment of the target condition of the utilization rate related to the specific area, the utilization rate adjustment unit 620 may transmit information indicating a new target condition to the battery stations located in the specific area. Upon determination of adjustment of the target condition of the utilization rate related to a specific battery station, the utilization rate adjustment unit 620 may transmit information indicating a new target condition to the battery station.

In the present embodiment, the event detection unit 622 detects occurrence of the event that may cause a change in the utilization rate of at least one battery station among the battery stations to be managed. Detecting the occurrence of the event includes a mode of detecting prediction of occurrence of the event, as well as a mode of detecting the actual occurrence of the event. For example, the event detection unit 622 detects at least the abnormality or the stop of the battery station to be managed on the basis of information acquired by the state monitoring unit 510.

In the present embodiment, the adjustment target extraction unit 624 extracts one or more battery stations (which may also be referred to as adjustment targets) to adjust the target condition of the utilization rate when the occurrence of the event is detected. For example, the adjustment target extraction unit 624 extracts the adjustment target according to the following procedure.

First, the adjustment target extraction unit 624 acquires information, for example, indicating the utilization rate of each battery station to be managed from the state monitoring unit 510. The adjustment target extraction unit 624 also acquires information indicating detection of occurrence of the event from the event detection unit 622. The adjustment target extraction unit 624 may acquire the station ID of the battery station where the event has occurred from the event detection unit 622.

Next, when the occurrence of the event is detected, the adjustment target extraction unit 624 extracts one or more battery stations related to the battery station in which the event has occurred from the plurality of battery stations to be managed. The adjustment target extraction unit 624 may refer to the relevance information storage unit 574 and extract one or more battery stations related to the battery station in which the event has occurred on the basis of the relevance between the battery stations.

For example, when the event detection unit 622 detects the abnormality or the stop of the battery station 210, the adjustment target extraction unit 624 extracts the battery station (e.g., one or more battery stations 212) whose relevance to the battery station 210 satisfies a predetermined condition as the battery station related to the battery station 210. The predetermined condition may be determined on the basis of at least one of (i) an item related to specifications, (ii) an item related to rent record, and (iii) an item related to the utilization rate of the battery station 210 in which the abnormality or the stop has been detected.

According to one embodiment, the condition is determined in a manner that the larger the maximum storage number and/or the charging capacity of the battery station 210, the wider the range of battery stations extracted as the battery stations related to the battery station 210. According to another embodiment, the condition is determined in a manner that the larger the predicted value of the number of rent items, which is calculated on the basis of the past rent record, during the period until the abnormality or stop is resolved, the wider the battery stations extracted as the battery stations related to the battery station 210. According to yet another embodiment, the condition is determined in a manner that the larger the target condition of the utilization rate in the period until the abnormality or the stop is resolved, the wider the range of the battery stations extracted as the battery stations related to the battery station 210.

In the present embodiment, the adjustment amount determination unit 626 determines to adjust the utilization rate of at least one of the one or more adjustment targets extracted by the adjustment target extraction unit 624. For example, the adjustment amount determination unit 626 determines the battery station to be actually subjected to adjustment of the utilization rate from the target for adjustment extracted by the adjustment target extraction unit 624 on the basis of at least one of (i) an item related to a specification, (ii) an item related to a rent record, (iii) an item related to the utilization rate, and (iv) a located position of the battery station to be adjusted.

According to one embodiment, the adjustment amount determination unit 626 determines adjustment of the utilization rate of the battery station having a large maximum storage number and/or a large charging capacity from one or more battery stations 212 extracted by the adjustment target extraction unit 624. According to another embodiment, the adjustment amount determination unit 626 determines the battery station to be actually subjected to adjustment of the utilization rate so as to decrease the geographical variation from the one or more battery stations 212 extracted by the adjustment target extraction unit 624.

Further, the adjustment amount determination unit 626 may determine the adjustment amount of the target condition of the utilization rate (which may also be referred to as the adjustment amount of the utilization rate) for the battery station determined to be subjected to adjustment of the utilization rate by the adjustment amount determination unit 626. The adjustment amount determination unit 626 may determine the adjustment amount of the target condition of the utilization rate for each of the one or more adjustment targets extracted by the adjustment target extraction unit 624.

In one embodiment, the adjustment amount determination unit 626 determines the adjustment amount of the target condition of the utilization rate on the basis of the relevance between the battery station whose utilization rate is determined to be adjusted by the adjustment amount determination unit 626 and the battery station 210. In another embodiment, the adjustment amount determination unit 626 determines the adjustment amount of the target condition of the utilization rate on the basis of at least one of (i) an item related to the specification, (ii) an item related to the rent record, and (iii) an item related to the utilization rate of the battery station 210 in which the abnormality or the stop is detected. The adjustment amount determination unit 626 may determine the adjustment amount of the target condition of the utilization rate on the basis of at least one of the specification, the rent record, and the utilization rate of the battery station 210 according to the same procedure as the extraction processing in the adjustment target extraction unit 624.

Figure 7:
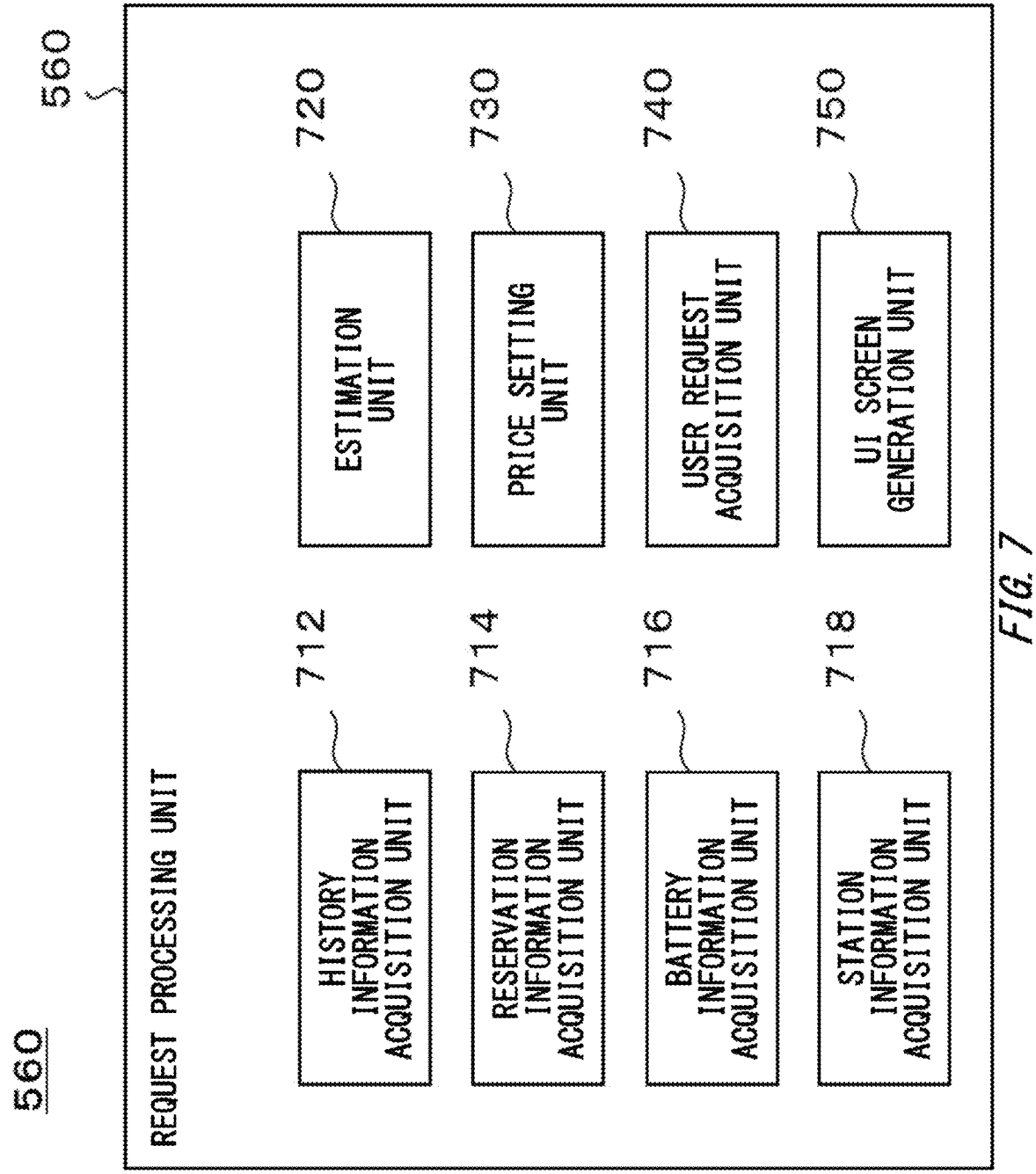
FIG. 7 schematically illustrates an example of an internal configuration of a request processing unit 560.

FIG. 7 schematically illustrates an example of an internal configuration of the request processing unit 560. In the present embodiment, the request processing unit 560 includes, for example, a history information acquisition unit 712, a reservation information acquisition unit 714, a battery information acquisition unit 716, a station information acquisition unit 718, an estimation unit 720, a price setting unit 730, a user request acquisition unit 740, and a UI screen generation unit 750.

The history information acquisition unit 712 may be an example of the charging speed acquisition unit and the moving speed acquisition unit. The reservation information acquisition unit 714 may be an example of the user position acquisition unit. The battery information acquisition unit 716 may be an example of the charging speed acquisition unit and the charge state acquisition unit. The station information acquisition unit 718 may be an example of the arrangement information acquisition unit. The estimation unit 720 may be an example of the information processing apparatus, the charge state estimation unit, and the state information generation unit. The UI screen generation unit 750 may be an example of the state information generation unit.

In the present embodiment, upon receipt of a battery station search request or a mobile battery reservation request from the user terminal 230, the request processing unit 560 transmits information on the battery station that meets the user request to the user terminal 230. In addition, the request processing unit 560 provides a GUI for search processing or reservation processing.

In the present embodiment, the history information acquisition unit 712 acquires various kinds of history information. In one embodiment, the history information acquisition unit 712 acquires history information regarding the charging capability of the battery station from the station information storage unit 576. For example, the history information acquisition unit 712 acquires information on the charging speed when the battery station has previously charged the mobile battery 22.

In another embodiment, the history information acquisition unit 712 may acquire, from the battery information storage unit 572, information on the movement history of an arbitrary user and/or information on the moving speed of the user. The history information acquisition unit 712 may acquire the statistic amount of the moving speed of the user from the battery information storage unit 572. The history information acquisition unit 712 may acquire the statistic amount of fuel consumption or electricity consumption of the user from the battery information storage unit 572. The history information acquisition unit 712 may acquire the statistic amount of power consumption per unit time of the user from the battery information storage unit 572. The history information acquisition unit 712 may calculate, on the basis of the information related to the movement history of a user, the statistic amount of at least one of (i) a moving speed, (ii) fuel consumption or electricity consumption, and (iii) power consumption per unit time of the user.

In the present embodiment, the reservation information acquisition unit 714 acquires reservation information indicating the content of reservation of the mobile battery 22. For example, the reservation information acquisition unit 714 acquires reservation information on the mobile battery 22 from the reservation management unit 540. As described above, the reservation information includes, for example, information on the user ID, the receipt date, the scheduled time of receipt, the station ID, the battery ID, a desired charge state, a usage fee, a payment method, and the like. The reservation information may include information indicating the reservation time and information indicating the position of the user at the reservation time.

In the present embodiment, the battery information acquisition unit 716 acquires various kinds of information regarding the mobile battery 22. For example, the battery information acquisition unit 716 acquires information indicating the charge state of the mobile battery 22 from the battery information storage unit 572. The battery information acquisition unit 716 may acquire information indicating the charge state at specific time. For example, the battery information acquisition unit 716 acquires information indicating the charge state at the current time or the latest measurement time. The battery information acquisition unit 716 may acquire information regarding the charging speed when the arbitrary mobile battery 22 is charged by the battery station in the past.

In the present embodiment, the station information acquisition unit 718 acquires various kinds of information regarding the battery station. The station information acquisition unit 718 may acquire arrangement information indicating the position where the station is located from the station information storage unit 576. For example, the station information acquisition unit 718 acquires the arrangement information of the battery station indicated by the station ID using, as a key, the station ID included in the reservation information acquired by the reservation information acquisition unit 714. The station information acquisition unit 718 may acquire information indicating the priority order of the one or more mobile batteries 22 stored in the battery station indicated by the station ID, using, as a key, the station ID included in the reservation information acquired by the reservation information acquisition unit 714.

In the present embodiment, the estimation unit 720 estimates the charge state of the mobile battery 22 at specific time in the future. For example, the estimation unit 720 estimates the charge state of a specific mobile battery 22 at scheduled time when the user identified by a user ID included in reservation information of the specific mobile battery 22 arrives at the battery station (which may also be referred to as estimated time of arrival) identified by the station ID included in the reservation information.

The estimation unit 720 estimates the charge state of the mobile battery 22, for example, according to the following procedure. First, the estimation unit 720 estimates the estimated time of arrival. For example, the estimation unit 720 acquires reservation information from the reservation information acquisition unit 714. The reservation information may include information indicating the position of the user at the reservation time. The reservation time may be an example of the specific time. The estimation unit 720 acquires the arrangement information of the battery station identified by the station ID included in the reservation information from the station information acquisition unit 718. The estimation unit 720 acquires information on the moving speed of the user identified by the user ID included in the reservation information from the history information acquisition unit 712. Then, the estimation unit 720 estimates the estimated time of arrival on the basis of the arrangement information of the battery station, the information indicating the position of the user at the time of reservation, and the information indicating the moving speed of the user. The estimation unit 720 may estimate the estimated time of arrival by further using traffic information, accident information, weather information, and the like. When the reservation information includes information indicating the scheduled time of receipt, the scheduled time of receipt may be used as the estimated time of arrival.

Next, the estimation unit 720 estimates the amount of change of the charge state if the mobile battery 22 is charged between the reservation time and the arrival time. Examples of the amount of change in the charge state include, for example, an increase amount of the SOC. First, the estimation unit 720 acquires information, from the history information acquisition unit 712, on the charging speed at which the battery station identified by the station ID included in the reservation information charges the mobile battery 22 identified by the battery ID included in the reservation information. The information regarding the charging speed may be the statistic amount of the charging speed. The estimation unit 720 may use the charging speed at which the battery station identified by the station ID included in the reservation information charges another mobile battery 22 as the information on the charging speed of the mobile battery 22 identified by the battery ID included in the reservation information. The estimation unit 720 estimates the amount of change of the charge state on the basis of the information related to the reservation time, the estimated time of arrival, and the charging speed.

Next, the estimation unit 720 estimates the charge state at the estimated time of arrival. The estimation unit 720 acquires, for example, information indicating the charge state of the mobile battery 22 identified by the battery ID included in the reservation information at the reservation time from the battery information acquisition unit 716. If the charge state at the reservation time is unknown, the estimation unit 720 may access the battery information storage unit 572 and acquire information indicating the charge state at the time closest to the reservation time. The estimation unit 720 estimates the charge state at the estimated time of arrival on the basis of the charge state at the reservation time and the amount of change of the charge state.

In the present embodiment, the estimation unit 720 temporarily estimates the usage situation when the user uses a specific mobile battery 22. For example, when the user uses the mobile battery 22 as the power source of the moving object, the estimation unit 720 estimates the distance that can be traveled using the mobile battery 22. The estimation unit 720 acquires information on the fuel consumption or electric fuel consumption, or the power consumption per unit time of the user from the battery information acquisition unit 716. Examples of the unit time include a time period of 1 hour, 1 day, and the like. The estimation unit 720 calculates a travelable distance on the basis of the charge state at the estimated time of arrival, the fuel consumption, the electricity consumption or the power consumption described above.

In the present embodiment, the price setting unit 730 generates information related to at least one of the usage fee, incentive, and penalty of the mobile battery 22. In one embodiment, the price setting unit 730 sets a discount fee or an incentive. For example, the price setting unit 730 acquires information regarding the priority order set for the mobile battery 22 from the station information acquisition unit 718. The estimation unit 720 sets the discount fee or the incentive when the priority order satisfies a predetermined condition. Examples of the predetermined condition include the condition of being ranked higher than a predetermined rank.

In another embodiment, the price setting unit 730 sets an extra fee or penalty. For example, the price setting unit 730 acquires information regarding the priority order set for the mobile battery 22 from the station information acquisition unit 718. The estimation unit 720 sets the extra fee or the penalty when the priority order satisfies a predetermined condition. Examples of the predetermined condition include, for example, the condition of being ranked lower than a predetermined rank. The estimation unit 720 may set the extra fee or the penalty corresponding to an additional request from the user.

In the present embodiment, the user request acquisition unit 740 acquires various requests from the user terminal 230. For example, the user request acquisition unit 740 acquires a search request for requesting a search for a battery station that meets a specific condition from the user terminal 230. The user request acquisition unit 740 acquires a reservation request for requesting reservation of any or specific mobile battery from the user terminal 230. Upon receipt of the request from the user terminal 230, the user request acquisition unit 740 starts information processing corresponding to the request.

In the present embodiment, the UI screen generation unit 750 generates a UI screen. For example, the UI screen generation unit 750 generates data for causing the user terminal 230 to generate the UI screen (which may also be referred to as UI screen data). The UI screen generation unit 750 generates, for example, data of the UI screen that provides a search request GUI in response to the receipt of the search request by the user request acquisition unit 740. The UI screen generation unit 750 may generate the UI screen data that provides a reservation request GUI in response to the receipt of the reservation request by the user request acquisition unit 740. When the UI screen data is executed on the user terminal 230, the UI screen in which, for example, (i) the charge state at specific time and (ii) the charge state at the estimated time of arrival of the user are associated for at least one of the one or more mobile batteries 22 may be output to the user. The UI screen generation unit 750 may generate the UI screen data for displaying, for example, by associating the charge state at the time when the search request or the reservation request is transmitted or received with the charge state at the estimated time of arrival of the user. The time when the search request or the reservation request is transmitted or received may be an example of the specific time. Details of the UI screen will be described later.

The UI screen generation unit 750 generates the UI screen data according to, for example, the following procedure. The UI screen generation unit 750 first acquires information on the charge state of each of the one or more mobile batteries 22 that matches the search request or the reservation request at the time when the search request or the reservation request is transmitted or received from the battery information acquisition unit 716. The UI screen generation unit 750 acquires information on the charge state of each of the one or more mobile batteries 22 at the estimated time of arrival at each of the one or more battery stations that match the search request or reservation request from the estimation unit 720. Next, the UI screen generation unit 750 generates, on the basis of the information on the charge state from the battery information acquisition unit 716 and the information on the charge state from the estimation unit 720, the UI screen data for display by associating the charge state of each of the one or more mobile batteries 22 at the time when the search request or the reservation request is transmitted or received with the charge state of each of the one or more mobile batteries 22 at the estimated time of arrival. The UI screen generation unit 750 may further generate the UI screen data to which an item related to at least one of the usage fee and the incentive is associated.

Figure 8:
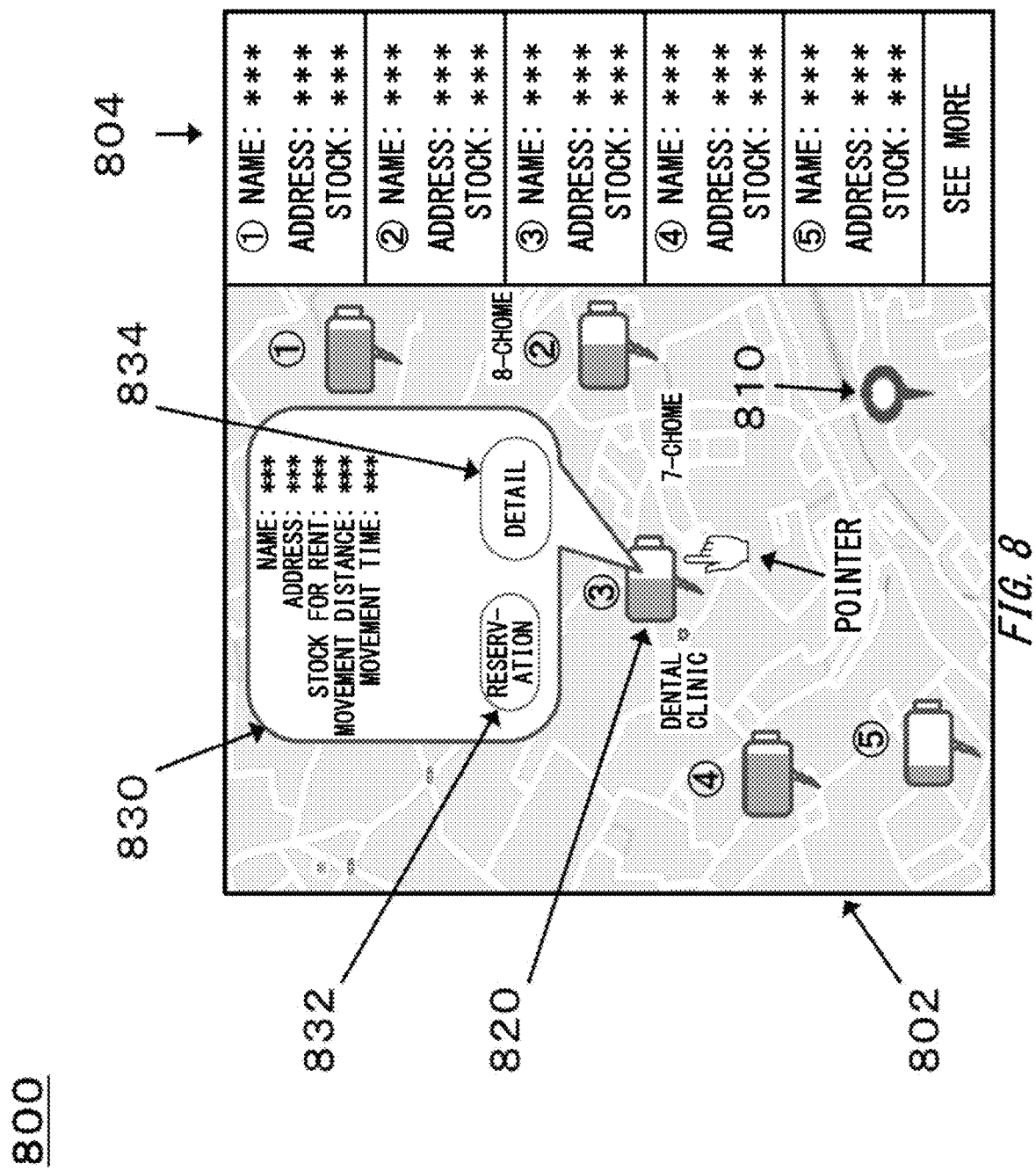
FIG. 8 schematically illustrates an example of a screen 800.

FIG. 8 schematically illustrates an example of the screen 800. In the present embodiment, the screen 800 includes a region 802 where map information is displayed and a region 804 where information other than a map is displayed. The region 804 may display information on one or more battery stations related to the area displayed in the region 802. The region 804 may display advertisement information.

In the present embodiment, various icons are arranged superimposed on the map in the region 802. For example, a pointer, an icon 810, an icon 820, and a pop-up screen 830 are arranged in the region 802. An icon 810 indicates the current position of the user. Icon 820 indicates the position of the battery station. The pop-up screen 830 displays information regarding the battery station indicated by the pointer. In the pop-up screen 830, an icon 832 and an icon 834 are disposed. In the icon 832, a command, for example, for transmitting the reservation request to the management server 220 is embedded. In the icon 834, a command, for example, for requesting detailed information regarding the battery station indicated by the pointer to the management server 220 is embedded.

Figure 9:
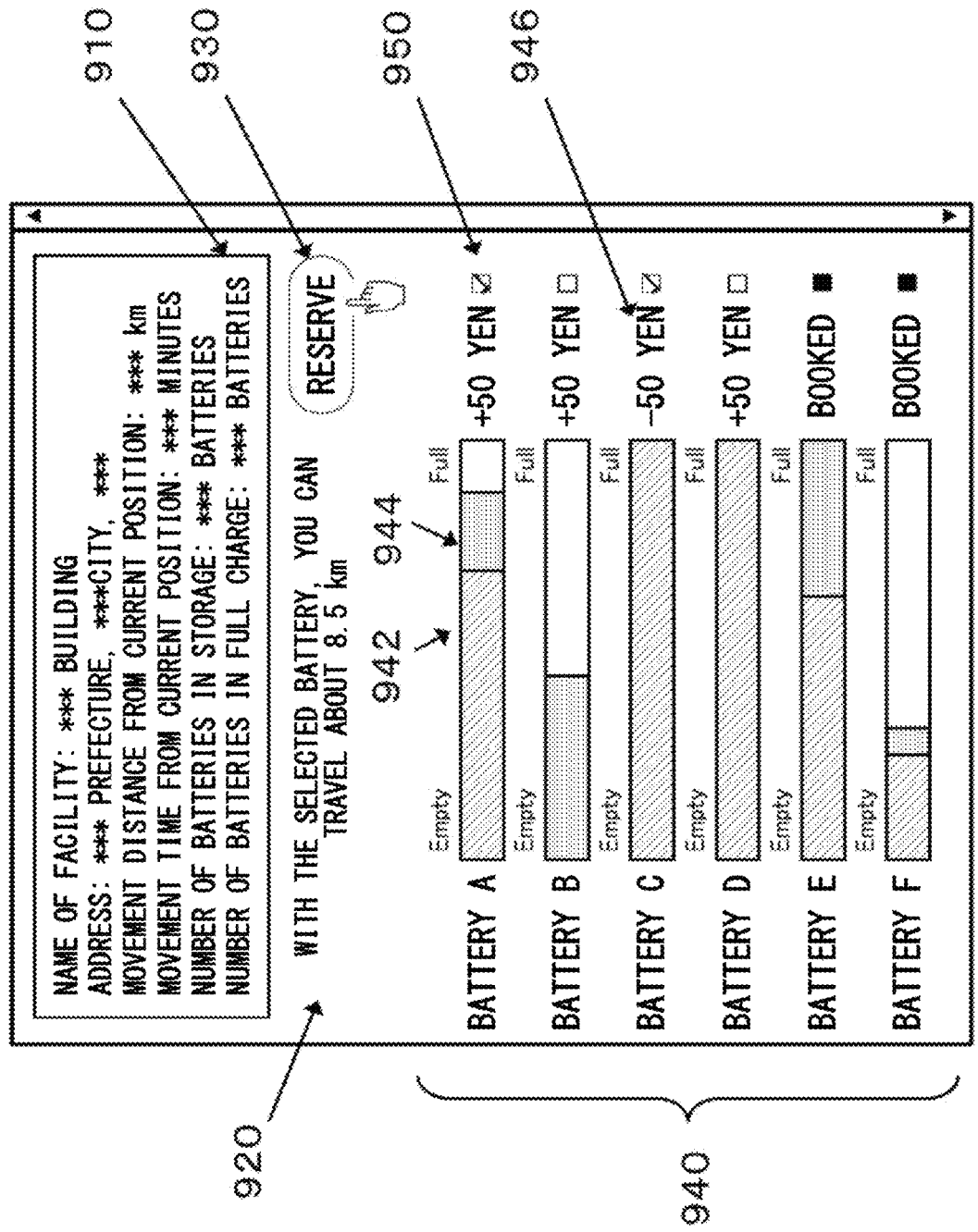
FIG. 9 schematically illustrates an example of a screen 900.

FIG. 9 schematically illustrates an example of a screen 900. In the present embodiment, the screen 900 may be an example of a screen displayed when the user clicks the icon 834 of the screen 800 displayed on the display device of the user terminal 230. In the present embodiment, the screen 900 includes a region 910, a region 920, an icon 930, a region 940, a region 946, and an icon 950.

The region 910 displays basic information about the battery station. The region 920 displays information indicating a distance for which the moving object can travel when the battery selected by the user is used as the power source of the moving object. In the icon 930, a command, for example, for transmitting the reservation request to the management server 220 is embedded. The region 940 displays information indicating the charge state of at least some of the one or more mobile batteries stored in the battery station. The information indicating the charge state may include information indicating the current SOC 942 and information indicating an increase amount of the SOC 944 during the period from the reservation time to the estimated time of arrival. The region 946 displays information regarding the price setting. The icon 950 may be a check box for the user to select a battery corresponding to the icon 950.

Figure 10:
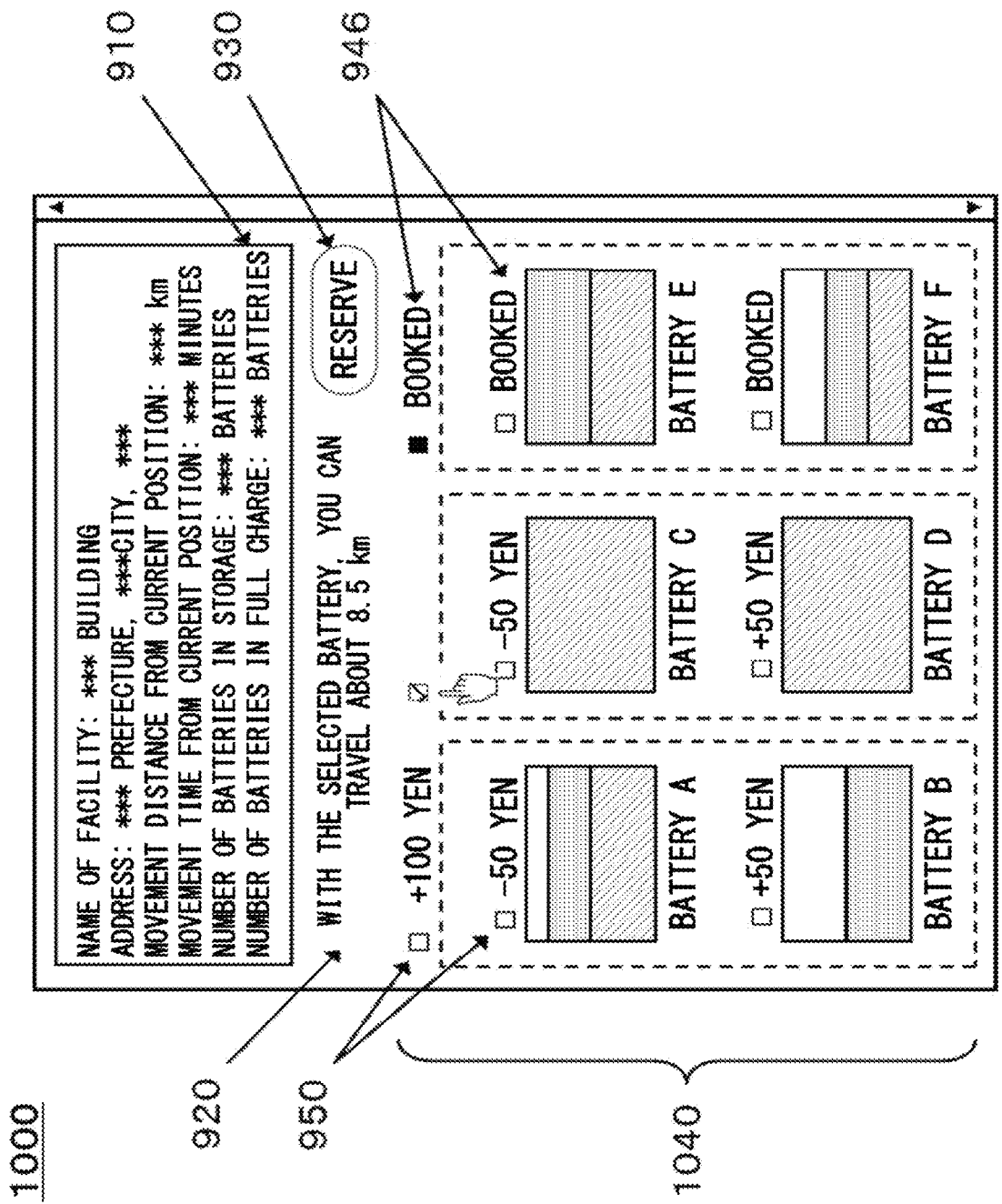
FIG. 10 schematically illustrates an example of a screen 1000.

FIG. 10 schematically illustrates an example of a screen 1000. In the present embodiment, the screen 1000 may be an example of a screen which is displayed when the user clicks the icon 834 of the screen 800 displayed on the display device of the user terminal 230. In the present embodiment, the screen 1000 may be an example of a screen provided when the battery station rents a set of a plurality of mobile batteries.

The screen 1000 is different from the screen 900 in that a region 1040 is provided instead of the region 940. The region 946 of the screen 1000 is different from the region 946 on the screen 900 in that information on the price setting for each battery is included. The icon 950 on the screen 1000 differs from the icon 950 on the screen 900 in that check boxes for allowing the user to select a battery set are included. The screen 1000 may be configured similarly to the screen 900 with respect to characteristics except for the above-described differences. According to the present embodiment, two mobile batteries surrounded by dotted lines in the region 1040 represent a set of batteries to be lent simultaneously.

FIG. 11 schematically illustrates an example of a data table 1100. In the present embodiment, the data table 1100 stores, for example, a battery ID 1110, a deterioration level 1120, a charging speed 1130, current SOC 1140, a renting status 1150, an operation status 1160, and a storage site 1170 which are mutually related to each other.

FIG. 12 schematically illustrates an example of a data table 1200. In the present embodiment, the data table 1200 stores, for example, a station ID 1210 and a related station ID 1220 which are related to each other. The related station ID 1220 may include a station ID 1230 of a battery station with a relatively high degree of relevance and a station ID 1240 of a battery station with a medium degree of relevance. The station ID 1230 may include a station ID 1232 of the battery station with a relatively high degree of relevance calculated for the area, a station ID 1234 of the battery station with a relatively high degree of relevance calculated for the distance, and a station ID 1236 of the battery station with a relatively high degree of relevance calculated for the renting history. The station ID 1240 may include a station ID 1242 of the battery station with a relatively high degree of relevance calculated for the area, a station ID 1244 of the battery station with a relatively high degree of relevance calculated for the distance, and a station ID 1246 of the battery station with a relatively high degree of relevance calculated for the renting history.

Although the present invention has been described above using the embodiments, the technical scope of the present invention is not limited to the range as described in the embodiments. It is apparent to those skilled in the art that various changes or modifications can be added to the above embodiment. Further, the items described in the specific embodiments can be applied to other embodiments as long as no technical contradiction arises. Further, constituent components may have the same characteristics as other constituent components with the same name but different reference numerals. Embodiments added with such alterations or improvements are apparently included in the technical scope of the present invention as defined in the appended claims.

It should be noted that the order of executing the processing including operations, procedures, steps, and stages of the devices, systems, programs, and methods illustrated in the appended claims, the specification, and the accompanying drawings is not particularly recited as "before", "preceding to", or the like, and any order can be used unless the output of the previous processing is used in the later processing. Although the operation flow may be described using "first," "next", or the like in the appended claims, the specification, and the drawings, this does not necessarily mean to execute the operation flow in the recited order.

For example, the following matters are described in the present specification.

[Item 1-1]

An information processing apparatus, including an arrangement information acquisition unit that acquires arrangement information indicating a position where a charging device for charging one or more storage batteries is arranged, a user position acquisition unit that acquires user position information indicating a position of the user, a charge state acquisition unit that acquires information indicating at least one charge state of the one or more storage batteries at specific time, and a state information generation unit that generates information associating (i) a charge state at the specific time with (ii) a charge state at an estimated time of arrival of the user at the charging device of at least one of the one or more storage batteries, in accordance with (i) the arrangement information acquired by the arrangement information acquisition unit and (ii) the user position information acquired by the user position acquisition unit.

[Item 1-2]

The information processing apparatus according to item 1-1, further including a charging speed acquisition unit that acquires information on the charging speed of the charging device, a moving speed acquisition unit that acquires information on the moving speed of the user, and a charge state estimation unit that estimates a charge state at the estimated time of arrival, in which the charge state estimation unit estimates the estimated time of arrival in accordance with (i) the arrangement information acquired by the arrangement information acquisition unit, (ii) the user position information acquired by the user position acquisition unit, and (iii) the information on the moving speed of the user acquired by the moving speed acquisition unit, and estimates the charge state at the estimated time of arrival in accordance with the specific time, the estimated time of arrival having been estimated, and the information on the charging speed of the charging device acquired by the charging speed acquisition unit, and the state information generation unit generates, in accordance with the charge state at the estimated time of arrival estimated by the charge state estimation unit, information associating (i) the charge state at the specific time with (ii) the charge state at the estimated time of arrival of the user at the charging device.

[Item 1-3]

The information processing apparatus according to item 1-2, in which the information on the moving speed of the user is a statistic amount of the moving speed of the user.

[Item 1-4]

The information processing apparatus according to item 1-3, in which the moving speed acquisition unit acquires the movement history information indicating the movement history of the user, and calculates the statistic amount of the moving speed of the user in accordance with the movement history of the user.

[Item 1-5]

The information processing apparatus according to any one of items 1-1 to 1-4, in which.

the state information generation unit generates information to output a screen at a communication terminal of the user, illustrating (i) the charge state at the specific time and (ii) the charge state at the estimated time of arrival of the user at the charging device regarding at least some of the one or more storage batteries.

[Item 1-6]

The information processing apparatus according to any one of items 1-1 to 1-5, in which the state information generation unit generates, for at least one of the one or more storage batteries, (i) the charge state at the specific time, (ii) the charge state at the estimated time of arrival of the user at the charging device, and (iii) information to which an item related to at least one of a usage fee and an incentive is associated.

[Item 1-7]

A program for causing a computer to function as the information processing apparatus according to any one of items 1-1 to 1-6.

[Item 1-8]

An information processing method, including acquiring arrangement information indicating a position where a charging device for charging one or more storage batteries is arranged, acquiring user position information indicating a position of the user, acquiring information indicating at least one charge state of the one or more storage batteries at specific time, and generating state information associating (i) a charge state at the specific time with (ii) a charge state at an estimated time of arrival of the user at the charging device of at least one of the one or more storage batteries, in accordance with (i) the arrangement information acquired by the arrangement information acquisition step and (ii) the user position information acquired by the user position acquisition step.

[Item 2-1]

An information processing apparatus including a deterioration information acquisition unit that acquires deterioration information indicating a deterioration state of each of a plurality of storage batteries, a temperature condition determination unit that determines a temperature condition allowable at the start of charging or during charging for each of the plurality of storage batteries in accordance with the deterioration information acquired by the deterioration information acquisition unit, a temperature information acquisition unit that acquires temperature information indicating the temperature of each of the plurality of storage batteries, and a charge target extraction unit that extracts a storage battery to be charged from the storage batteries among the plurality of storage batteries in which the temperature indicated by the temperature information acquired by the temperature information acquisition unit satisfies the temperature condition determined by the temperature condition determination unit.

[Item 2-2]

The information processing apparatus according to items 2-1, further including a demand acquisition unit that acquires demand information regarding the demand for the storage batteries, and a charge state acquisition unit that acquires information indicating a charge state of the plurality of storage batteries at specific time, in which the charge target extraction unit extracts the storage battery to be charged when none of the plurality of storage batteries satisfy the demand indicated by the demand information acquired by the demand acquisition unit.

[Item 2-3]

The information processing apparatus according to items 2-2, in which the demand information includes information on time or a period and information indicating a number of storage batteries required at the time or the period.

[Item 2-4]

The information processing apparatus according to items 2-2 or items 2-3, in which the demand information includes information indicating a number of required storage batteries and information indicating a condition regarding the charge state of each of the storage batteries.

[Item 2-5]

The information processing apparatus according to any one of items 2-1 to 2-4, in which the temperature condition determination unit determines the temperature condition in a manner that, as the deterioration of the storage battery develops, (i) the allowable temperature range is widened, (ii) a maximum allowable temperature is raised, or (iii) a minimum allowable temperature is lowered.

[Item 2-6]

The information processing apparatus according to any one of items 2-1 to 2-4, in which the temperature condition determination unit determines the temperature condition in a manner that, as the deterioration of the storage battery develops, (i) the allowable temperature range is narrowed, (ii) the maximum allowable temperature is lowered, or (iii) the minimum allowable temperature is raised.

[Item 2-7]

The information processing apparatus according to any one of items 2-1 to 2-6, in which each of the plurality of storage batteries has a memory for storing the deterioration information on each of the storage batteries, and the deterioration information acquisition unit acquires the deterioration information of the storage battery from a memory of each of the storage batteries.

[Item 2-8]

A program for causing a computer to function as the information processing apparatus according to any one of items 2-1 to 2-7.

[Item 2-9]

An information processing method including acquiring temperature information indicating a temperature of each of a plurality of storage batteries, acquiring deterioration information indicating a deterioration state of the each of the plurality of storage batteries, determining a temperature condition allowable at the start of charging or during charging for the each of the plurality of storage batteries in accordance with the deterioration information acquired in the deterioration information acquiring, and extracting a storage battery to be charged from the storage batteries among the plurality of storage batteries in which the temperature indicated by the temperature information acquired in the temperature information acquiring satisfies the temperature condition determined in the temperature condition determining.

[Item 3-1]

An information processing apparatus, including an abnormality detection unit that detects abnormality or stop of at least one of a plurality of storage battery housing devices, a storage device extraction unit that extracts, when the abnormality detection unit detects the abnormality or the stop, one or more storage battery housing devices related to the storage battery housing device in which the abnormality or the stop is detected from among the plurality of storage battery housing devices, and an adjustment unit that determines adjustment of at least one utilization rate of the one or more storage battery housing devices extracted by the storage device extraction unit.

[Item 3-2]

The information processing apparatus according to item 3-1, in which each of the plurality of storage battery housing devices stores at least one portable storage battery.

[Item 3-3]

The information processing apparatus according to item 3-1 or item 3-2, in which for at least one storage battery housing device included in the plurality of storage battery housing devices, the storage device extraction unit refers to the storage battery housing device and a relevance level storage unit that stores information indicating a relevance level of the one or more other storage battery housing devices, and extracts one or more storage battery housing devices related to the storage battery housing device in which the abnormality or the stop is detected.

[Item 3-4]

The information processing apparatus according to item 3-3, in which the storage device extraction unit extracts, as the one or more storage battery housing devices, the storage battery housing device of which the relevance level relative to the storage battery housing device in which the abnormality or the stop is detected satisfies a predetermined condition.

[Item 3-5]

The information processing apparatus according to item 3-4, in which the predetermined condition is determined in accordance with at least one of (i) a specification, (ii) an item relating to rent record, and (iii) an item relating to a utilization rate of the storage battery housing device in which the abnormality or the stop is detected.

[Item 3-6]

The information processing apparatus according to any one of items 3-3 to 3-5, in which the relevance level is determined in accordance with at least one of (i) a geographical relationship between each of the at least one storage battery housing device and each of the one or more other storage battery housing devices, and (ii) a movement history of the storage battery between each of the at least one storage battery housing device and each of the one or more other storage battery housing devices.

[Item 3-7]

The information processing apparatus according to any one of items 3-3 to 3-6, in which the adjustment unit determines an adjustment amount of the utilization rate in accordance with the relevance level.

[Item 3-8]

The information processing apparatus according to any one of items 3-1 to 3-7, wherein the adjustment unit determines the adjustment amount of the utilization rate based on at least one of (i) items related to specifications, (ii) items related to a rent record, and (iii) items related to the utilization rate of the storage battery housing device in which the abnormality or the stop is detected.

[Item 3-9]

The information processing apparatus according to any one of items 3-1 to 3-8 above, further comprising the relevance level storage unit.

[Item 3-10]

The information processing apparatus according to any one of items 3-1 to 3-9, further including the plurality of storage battery housing devices.

[Item 3-11]

A program for causing a computer to function as the information processing apparatus according to any one of items 3-1 to 3-8.

[Item 3-12]

An information processing method, including detecting abnormality or stop of at least one of a plurality of storage battery housing devices, extracting, when the abnormality or the stop is detected by the abnormality detecting step, one or more storage battery housing devices related to the storage battery housing device in which the abnormality or the stop is detected from among the plurality of storage battery housing devices, and determining adjustment of at least one utilization rate of the one or more storage battery housing devices extracted by the storage device extracting step.

REFERENCE SIGNS LIST

10 Communication network
22 Mobile battery
34 Power generation device
36 Power system
38 Electric device
100 Information processing apparatus
110 Abnormality detection unit
120 Storage device extraction unit
130 Adjustment unit
200 Battery management system
210 Battery station
212 Battery station
214 Battery station
220 Management server
230 User terminal
312 Power meter
314 Distribution panel
320 Control circuit
330 Battery storage unit
332 Connector
340 Sense unit
350 Control unit
352 Communication control unit
354 Charge/discharge control unit
356 State management unit
410 Deterioration state determination unit
420 Discharge management unit
430 Charge management unit
442 Battery information acquisition unit
444 Utilization rate information acquisition unit
446 Demand information acquisition unit
452 Charge condition determination unit
454 Charge condition storage unit
460 Schedule determination unit
510 State monitoring unit
520 Relevance calculation unit
530 Utilization rate management unit
540 Reservation management unit
550 Communication control unit
560 Request processing unit
570 Storage unit
572 Battery information storage unit
574 Relevance information storage unit
576 Station information storage unit
610 Utilization rate determination unit
612 Supply and demand prediction unit
614 Area utilization rate determination unit
616 Individual utilization rate determination unit
620 Utilization rate adjustment unit
622 Event detection unit
624 Adjustment target extraction unit
626 Adjustment amount determination unit
712 History information acquisition unit
714 Reservation information acquisition unit
716 Battery information acquisition unit
718 Station information acquisition unit
720 Estimation unit
730 Price setting unit
740 User request acquisition unit
750 UI screen generation unit
800 Screen
802 Region
804 Region
810 Icon
820 Icon 830 Pop-up screen
832 Icon
834 Icon
900 Screen
910 Region
920 Region
930 Icon
940 Region
942 SOC
944 Increase amount
946 Region
950 Icon
1000 Screen
1040 Region
1100 Data table
1110 Battery ID
1120 Deterioration level
1130 Charging speed
1140 SOC
1150 Rent status
1160 Operation status
1170 Storage site
1200 Data table
1210 Station ID
1220 Related station ID
1230 Station ID
1232 Station ID
1234 Station ID
1236 Station ID
1240 Station ID
1242 Station ID
1244 Station ID
1246 Station ID

The invention claimed is:

1. An information processing apparatus, comprising:
an abnormality detection unit that detects at least one abnormality or stop of a plurality of storage battery housing devices;
a storage device extraction unit that extracts, when the abnormality detection unit detects the abnormality or the stop, one or more related storage battery housing devices from among the plurality of storage battery housing devices, the one or more related storage battery housing devices being related to a detected storage battery housing device in which the abnormality or the stop is detected;
an adjustment unit that determines an adjustment amount of utilization rate of at least one of the one or more related storage battery housing devices extracted by the storage device extraction unit; and
a relevance level storage unit that stores information regarding at least one storage battery housing device included in the plurality of storage battery housing devices, the information indicating a relevance level between the at least one storage battery housing device and one or more other storage battery housing devices,
wherein the storage device extraction unit refers to the information stored in the relevance level storage unit such that the storage device extraction unit extracts the one or more related storage battery housing devices related to the detected storage battery housing device, and
wherein the relevance level is determined in accordance with at least one of (i) a movement history of a storage battery between the at least one storage battery housing device included in the plurality of storage battery housing devices and one of the one or more other storage battery housing devices and (ii) a geographical relationship between the at least one storage battery housing device included in the plurality of storage battery housing devices and the one of the one or more other storage battery housing devices.

2. The information processing apparatus according to claim 1, wherein each of the plurality of storage battery housing devices stores at least one portable storage battery.

3. The information processing apparatus according to claim 1, wherein the storage device extraction unit extracts, as the one or more related storage battery housing devices, one or more of the plurality of storage battery housing devices of which the relevance level relative to the detected storage battery housing device satisfies a predetermined condition.

4. The information processing apparatus according to claim 3, wherein the predetermined condition is determined additionally in accordance with at least one of (i) an item relating to a specification, (ii) an item relating to rent record, and (iii) an item relating to a utilization rate of the detected storage battery housing device.

5. The information processing apparatus according to claim 1, wherein the adjustment unit determines the adjustment amount of the utilization rate in accordance with at least the relevance level.

6. The information processing apparatus according to claim 1, wherein the adjustment unit determines the adjustment amount of the utilization rate additionally in accordance with at least one of (i) an item related to a specification, (ii) an item related to a rent record, and (iii) an item related to the utilization rate of the detected storage battery housing device.

7. The information processing apparatus according to claim 1, further comprising the plurality of storage battery housing devices.

8. A non-transitory computer readable storage medium storing a program that causes a computer to execute a process comprising:
abnormality detecting by detecting at least one abnormality or stop of a plurality of storage battery housing devices;
extracting one or more storage battery housing devices by using a storage device extraction unit to extract, when the abnormality or the stop is detected in the abnormality detecting, one or more related storage battery housing devices related to a detected storage battery housing device in which the abnormality or the stop is detected from among the plurality of storage battery housing devices;
determining an adjustment amount of utilization rate of at least one of the one or more related storage battery housing devices,
wherein the extracting one or more storage battery housing devices comprises:
storing information regarding at least one storage battery housing device included in the plurality of storage battery housing devices in a relevance level storage unit, the information indicating a relevance level between the at least one storage battery housing device and one or more other storage battery housing devices,
wherein the storage device extraction unit refers to the information stored in the relevance level storage unit such that the storage device extraction unit extracts the one or more related storage battery housing devices related to the detected storage battery housing device, and wherein the relevance level is determined in accordance with at least one of (i) a movement history of a storage battery between the at least one storage battery housing device included in the plurality of storage battery housing devices and one of the one or more other storage battery housing devices and (ii) a geographical relationship between the at least one storage battery housing device included in the plurality of storage battery housing devices and the one of the one or more other storage battery housing devices.

9. An information processing method, comprising:
abnormality detecting by detecting at least one abnormality or stop of a plurality of storage battery housing devices by a computer;
extracting one or more storage battery housing devices by using a storage device extraction unit to extract, when the abnormality or the stop is detected in the abnormality detecting, one or more related storage battery housing devices related to a detected storage battery housing device in which the abnormality or the stop is detected from among the plurality of storage battery housing devices by the computer;
determining an adjustment amount of utilization rate of at least one of the one or more related storage battery housing devices,
wherein the extracting one or more storage battery housing devices comprises:
storing information regarding at least one storage battery housing device included in the plurality of storage battery housing devices in a relevance level storage unit, the information indicating a relevance level between the at least one storage battery housing device and one or more other storage battery housing devices,
wherein the storage device extraction unit refers to the information stored in the relevance level storage unit such that the storage device extraction unit extracts the one or more related storage battery housing devices related to the detected storage battery housing device, and
wherein the relevance level is determined in accordance with at least one of (i) a movement history of a storage battery between the at least one storage battery housing device included in the plurality of storage battery housing devices and one of the one or more other storage battery housing devices and (ii) a geographical relationship between the at least one storage battery housing device included in the plurality of storage battery housing devices and the one of the one or more other storage battery housing devices.

* * * * *